United States Patent
Yan et al.

(10) Patent No.: US 9,510,459 B2
(45) Date of Patent: Nov. 29, 2016

(54) ENVIRONMENTAL SENSITIVE ELECTRONIC DEVICE PACKAGE AND MANUFACTURING METHOD THEREOF

(71) Applicant: Industrial Technology Research Institute, Hsinchu (TW)

(72) Inventors: Jing-Yi Yan, Hsinchu County (TW); Shu-Tang Yeh, Taichung (TW); Sheng-Wei Chen, Kinmen County (TW); Kuang-Jung Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 275 days.

(21) Appl. No.: 14/098,551

(22) Filed: Dec. 6, 2013

(65) Prior Publication Data

US 2014/0160710 A1  Jun. 12, 2014

Related U.S. Application Data

(60) Provisional application No. 61/733,907, filed on Dec. 6, 2012.

(30) Foreign Application Priority Data

Sep. 4, 2013  (TW) .............................. 102131813 A

(51) Int. Cl.
*H05K 3/30* (2006.01)
*H01L 51/52* (2006.01)
*G02F 1/1333* (2006.01)

(52) U.S. Cl.
CPC ........... *H05K 3/30* (2013.01); *G02F 1/133308* (2013.01); *H01L 51/5246* (2013.01);
(Continued)

(58) Field of Classification Search
CPC ................. H05H 1/141–1/144; H05K 3/429; H01L 2924/01079
USPC ................. 361/782–784, 792; 174/250–259
See application file for complete search history.

(56) References Cited

U.S. PATENT DOCUMENTS 6,576,351 B2   6/2003   Silvernail
6,998,776 B2   2/2006   Aitken et al.
(Continued)

FOREIGN PATENT DOCUMENTS

CN   1867217   11/2006
CN   101009303   8/2007
(Continued)

OTHER PUBLICATIONS

"Office Action of Taiwan Counterpart Application", issued on Oct. 8, 2015, p. 1-p. 4.
(Continued)

*Primary Examiner* — Tuan T Dinh
(74) *Attorney, Agent, or Firm* — Jianq Chyun IP Office

(57) ABSTRACT

An environmental sensitive electronic device package including a first substrate, a second substrate, an environmental sensitive electronic device, a side wall barrier structure, a first adhesive, and a second adhesive is provided. The environmental sensitive electronic device is located on the first substrate. The first adhesive is located on the first substrate. The side wall barrier structure is located on the first adhesive, and the side wall barrier structure is adhered to the first substrate through the first adhesive. The second adhesive is located on the side wall barrier structure. The side wall barrier structure is adhered to the second substrate through the second adhesive, and the side wall barrier structure, the first adhesive, and the second adhesive are located between the first substrate and the second substrate. A manufacturing method of an environmental sensitive electronic device package is also provided.

34 Claims, 18 Drawing Sheets

(52) U.S. Cl.
CPC ............... *H01L51/5259* (2013.01); *G02F 2001/133311* (2013.01); *G02F 2202/28* (2013.01); *Y10T 29/49128* (2015.01)

(56) References Cited

U.S. PATENT DOCUMENTS

| | | | |
|---|---|---|---|
| 7,541,671 B2 | 6/2009 | Foust et al. | |
| 8,093,512 B2* | 1/2012 | Chen | H01L 21/56 174/521 |
| 2002/0038997 A1* | 4/2002 | Sakai | C02F 3/04 313/495 |
| 2005/0184372 A1 | 8/2005 | Asahi et al. | |
| 2005/0224935 A1 | 10/2005 | Schaepkens et al. | |
| 2006/0118933 A1 | 6/2006 | Haba et al. | |
| 2007/0176550 A1* | 8/2007 | Kwan | H01L 51/5246 313/512 |
| 2008/0135998 A1 | 6/2008 | Witvrouw et al. | |
| 2009/0001871 A1* | 1/2009 | Song | H01J 63/06 313/503 |
| 2009/0167132 A1* | 7/2009 | Bae | H01L 51/5237 313/1 |
| 2010/0141866 A1* | 6/2010 | Ryu | H01J 63/02 349/61 |
| 2010/0258346 A1 | 10/2010 | Chen et al. | |
| 2010/0265207 A1 | 10/2010 | Chen | |
| 2011/0063808 A1 | 3/2011 | Chen et al. | |
| 2011/0101564 A1 | 5/2011 | Keenihan et al. | |
| 2012/0056523 A1* | 3/2012 | Han | H01L 27/3276 313/243 |
| 2012/0064278 A1 | 3/2012 | Chen | |

FOREIGN PATENT DOCUMENTS

| | | |
|---|---|---|
| CN | 101477997 | 7/2009 |
| JP | 2003532260 | 10/2003 |
| JP | 2009509036 | 3/2009 |
| KR | 20080108743 | 12/2008 |
| TW | 201037799 | 10/2010 |
| TW | 201205733 | 2/2012 |

OTHER PUBLICATIONS

A.P. Roberts, et al., "Gas permeation in silicon-oxide/polymer (SiOx/PET) barrier films: role of the oxide lattice, nano-defects and macro-defects," Journal of Membrane Science, vol. 208, Issues 1-2, Oct. 1, 2002, pp. 75-88.

M. S. Weaver, et al., "Organic light-emitting devices with extended operating lifetimes on plastic substrates," Applied Physics Letters, vol. 81, No. 16, Oct. 14, 2002, pp. 2929-2931.

P.E Burrows, et al., "Ultra barrier flexible substrates for flat panel displays," Displays, vol. 22, Issue 2, May 2001, pp. 65-69.

Jay S. Lewis, et al., "Thin-Film Permeation-Barrier Technology for Flexible Organic Light-Emitting Devices," IEEE Journal of Selected Topics in Quantum Electronics, Vol. 10, No. 1, Jan./Feb. 2004, pp. 45-57.

Yves Leterrier, "Durability of nanosized oxygen-barrier coatings on polymers," Progress in Materials Science, vol. 48, 2003, pp. 1-55.

John Fahlteich, et al., "Permeation barrier properties of thin oxide films on flexible polymer substrates," Thin Solid Films, vol. 517, 2009, pp. 3075-3080.

"Office Action of China Counterpart Application", issued on Mar. 14, 2016, p. 1-p. 16.

* cited by examiner

ENVIRONMENTAL SENSITIVE ELECTRONIC DEVICE PACKAGE AND MANUFACTURING METHOD THEREOF

CROSS-REFERENCE TO RELATED APPLICATION

This application claims the priority benefits of U.S. provisional application Ser. No. 61/733,907, filed on Dec. 6, 2012 and Taiwan application serial no. 102131813, filed on Sep. 4, 2013. The entirety of each of the above-mentioned patent applications is hereby incorporated by reference herein and made a part of this specification.

TECHNICAL FIELD

The technical field relates to an environmental sensitive electronic device package and a manufacturing method thereof.

BACKGROUND

With the progress of display technology, displays have been developed in the trend of slimness and planarization, and flexible displays (for example, foldable displays) have gradually become the next-generation displays. The flexible displays are made by flexible substrates in replacement of conventional rigid substrates. The flexible substrates are characterized by bendability, ease of carriage, compliance with safety standards, and extensive applications in consumer products. The flexible substrates also have large coefficient of thermal expansion and poor resistance to heat, moisture, oxygen, and chemicals. As to the application of the rigid flat panel display, a packaging process is often performed with use of glass frit cured by laser. When the glass frit is heated by laser and is then melted, upper and lower rigid glass substrates are adhered to each other by means of the melted glass frit, so as to block moisture and oxygen.

The flexible display may not block moisture and oxygen by performing said lateral packaging process applicable to the rigid glass substrates, and the packaged flexible display may still suffer from moisture infiltration and oxygen permeation. Thereby, aging of electronic components on the flexible substrate may be expedited, and the lifetime of these electronic components may be reduced. As a result, the market requirements may not be fully satisfied.

SUMMARY

According to an exemplary embodiment of the disclosure, an environmental sensitive electronic device package including a first substrate, a second substrate, an environmental sensitive electronic device, a side wall barrier structure, a first adhesive, and a second adhesive is provided. The environmental sensitive electronic device is located on the first substrate. The first adhesive is located on the first substrate. The side wall barrier structure is located on the first adhesive, and the side wall barrier structure is adhered to the first substrate through the first adhesive. The second adhesive is located on the side wall barrier structure. The side wall barrier structure is adhered to the second substrate through the second adhesive, and the side wall barrier structure, the first adhesive, and the second adhesive are located between the first substrate and the second substrate.

According to another exemplary embodiment of the disclosure, a manufacturing method of an environmental sensitive electronic device package includes: a first adhesive is formed on the first substrate, and the first substrate has an environmental sensitive electronic device thereon, a side wall barrier structure is disposed on the first adhesive, the side wall barrier structure is adhered to the first substrate through the first adhesive and surrounds the environmental sensitive electronic device, a second adhesive is formed on a second substrate, the second substrate and the side wall barrier structure are bonded together through the second adhesive, and the side wall barrier structure, the first adhesive, and the second adhesive are located between the first substrate and the second substrate.

According to another exemplary embodiment of the disclosure, an environmental sensitive electronic device package including a first substrate, a second substrate, an environmental sensitive electronic device, a side wall barrier structure, at least one first glass frit, and a second glass frit is provided. The environmental sensitive electronic device is located on the first substrate. The first glass frit is located on the first substrate. The side wall barrier structure is located on the first glass frit, and the side wall barrier structure is adhered to the first substrate through the first glass frit. The second glass frit is located on the side wall barrier structure. The side wall barrier structure is adhered to the second substrate through the second glass frit, and the side wall barrier structure, the first glass frit, and the second glass frit are located between the first substrate and the second substrate.

Several exemplary embodiments accompanied with figures are described in detail below to further describe the disclosure in details.

BRIEF DESCRIPTION OF DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

An exemplary embodiment of the disclosure provides an environmental sensitive electronic device package and a manufacturing method thereof to resolve an issue of the shortened lifetime of an environmental sensitive electronic device.

Figure 1A:
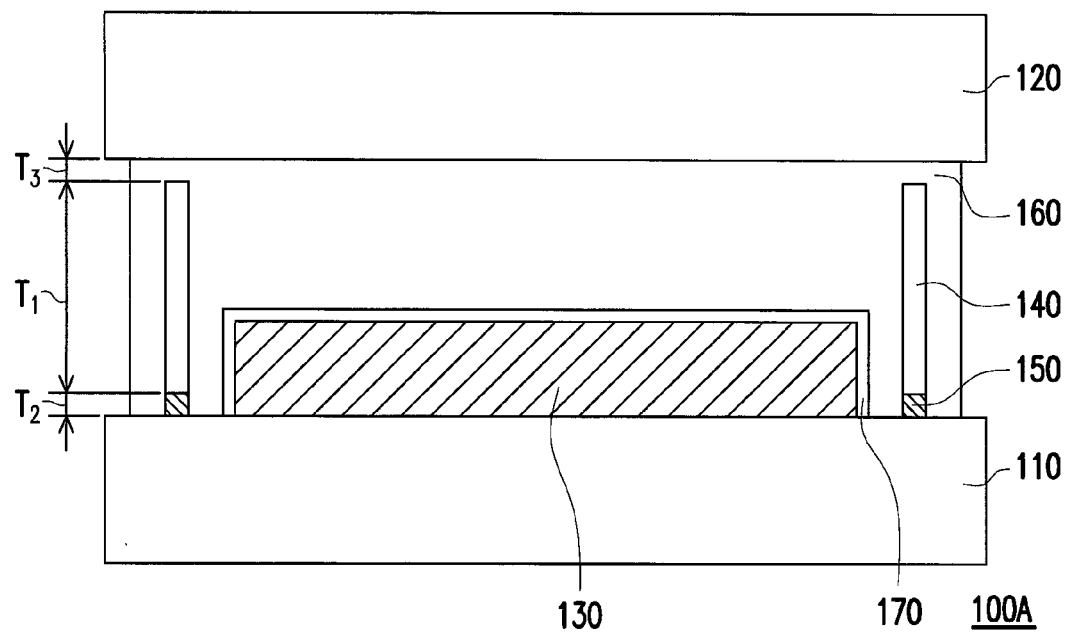
FIG. 1A is a schematic cross-sectional view illustrating an environmental sensitive electronic device package according to an exemplary embodiment of the disclosure.
Figure 1B:
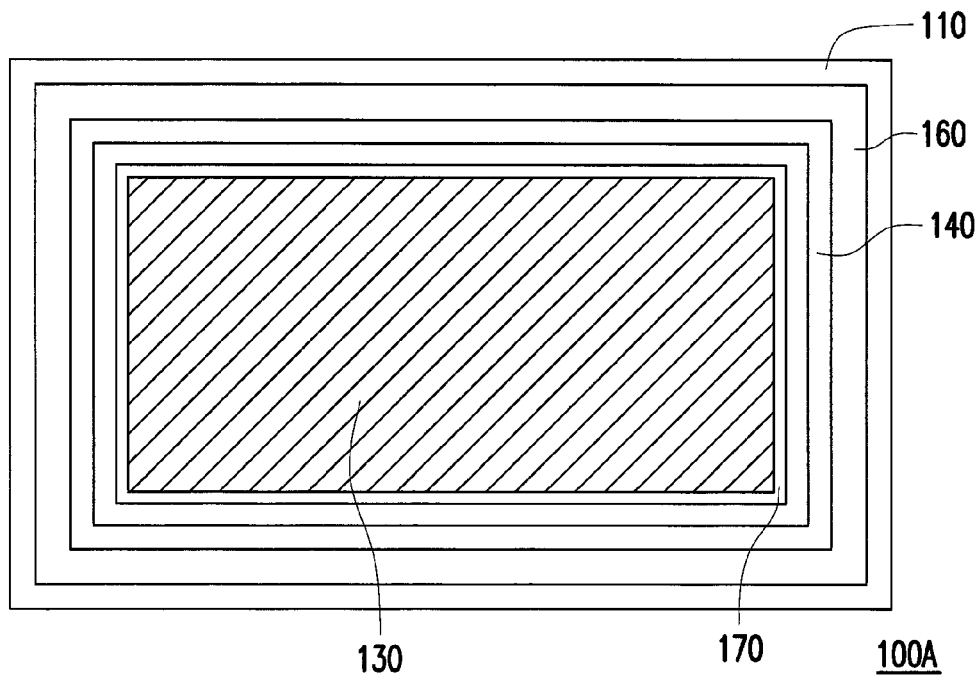
FIG. 1B is a top view illustrating the environmental sensitive electronic device package depicted in FIG. 1A.

FIG. 1A is a schematic cross-sectional view illustrating an environmental sensitive electronic device package according to an exemplary embodiment of the disclosure. FIG. 1B is a top view illustrating the environmental sensitive electronic device package depicted in FIG. 1A. With reference to FIG. 1A, an environmental sensitive electronic device package 100A described an exemplary embodiment of the disclosure includes a first substrate 110, a second substrate 120, an environmental sensitive electronic device 130, a side wall barrier structure 140, a first adhesive 150, and a second adhesive 160. The environmental sensitive electronic device 130 is located on the first substrate 110. The first adhesive 150 is located on the first substrate 110. The side wall barrier structure 140 is located on the first adhesive 150, and the side wall barrier structure 140 is adhered to the first substrate 110 through the first adhesive 150. The second adhesive 160 is located on the side wall barrier structure 140. The side wall barrier structure 140 is adhered to the second substrate 120 through the second adhesive 160, and the side wall barrier structure 140, the first adhesive 150, and the second adhesive 160 are located between the first substrate 110 and the second substrate 120.

In the present exemplary embodiment, the first substrate 110 and the second substrate 120 are flexible substrates or rigid substrates (e.g., glass substrates), for instance, and a material of the flexible substrates may be polyethylene (PE), polymethyl methacrylate (PMMA), polycarbonate (PC), or polyimide (PI). The aforesaid PE-containing plastic is flexible plastic and may include PEC, PEN, PES, and so forth, for instance. The flexible substrates may be made of metal, which should not be construed as a limitation to the disclosure.

Besides, the environmental sensitive electronic device 130 is, for instance, an active environmental sensitive electronic display device or a passive environmental sensitive electronic display device. The active environmental sensitive electronic display device is, for instance, an active matrix organic light emitting diode (AM-OLED), an active matrix electro phoretic display (AM-EPD) commonly known as electronic paper, an active matrix liquid crystal display (AM-LCD), or an active matrix blue phase liquid crystal display (AMBPLCD). The passive environmental sensitive electronic display device is, for instance, a passive matrix organic light-emitting device (PM-OLED) array substrate or a super twisted nematic liquid crystal display (STN-LCD). In the present exemplary embodiment, the environmental sensitive electronic device 130 is encapsulated by a packaging film 170. The packaging film 170 is, for instance, an organic packaging film, an inorganic packaging film, or the organic and inorganic packaging films alternately stacked together, which should not be construed as a limitation to the disclosure.

The side wall barrier structure 140 is made of an organic material, an inorganic material, or a combination thereof, for instance. Said materials may be rolled, molded, or stretched to form a sheet-shaped structure, and the sheet-shaped structure is further etched, transfer-printed, squeezed, or punched, so as to form a closed structure, as shown in FIG. 1B. In another embodiment, the side wall barrier structure 140 may be a closed structure formed by molding.

In most cases, the first adhesive 150 and the second adhesive 160 are optical adhesives with predetermined transmittance; an adhesive with optical reflectivity or a transflective adhesive may be applied in the present exemplary embodiment. The first adhesive 150 and the second adhesive 160 are made of epoxy resin, an acrylic compound, silicone, etc. According to the present exemplary embodiment, the first and second adhesives 150 and 160 are made of a material that may be cured by heat or light; namely, the material of the first and second adhesives 150 and 160 is not cured by heat or light, for instance. In the present exemplary embodiment, the first and second adhesives 150 may be selectively made of the same material or different materials, which should not be construed as a limitation to the disclosure.

With reference to FIG. 1A and FIG. 1B, the side wall barrier structure 140 described herein may be a closed structure that surrounds the environmental sensitive electronic device 130, while the disclosure is not limited thereto; in another exemplary embodiment, the side wall barrier structure 140 may be a structure including a plurality of separated patterns, and the side wall barrier structure 140 surrounds the environmental sensitive electronic device 130. In the present exemplary embodiment, the cross-section of the side wall barrier structure 140 perpendicular to the first substrate 110 is shaped as a rectangle, for instance. The shape of the cross-section of the side wall barrier structure 140 may also be a polygonal shape, a circular shape, or an elliptic shape, which should not be construed as a limitation to the disclosure. The side wall barrier structure 140 described herein is encapsulated by the second adhesive 160, and the second adhesive 160 further covers the environmental sensitive electronic device 130, the first adhesive 150, and the packaging film 170 and is adhered to the second substrate 120. The side wall barrier structure 140 has a thickness T1 that is smaller than or substantially equal to 1 mm, for instance. The first adhesive 150 located between the side wall barrier structure 140 and the first substrate 110 has a thickness T2, and the second adhesive 160 located between the side wall barrier structure 140 and the second substrate 120 has a thickness T3. Each of the thicknesses T2 and T3 is smaller than 15 μm.

In another exemplary embodiment, the first adhesive 150 in the environmental sensitive electronic device package 100A depicted in FIG. 1A may be replaced by a first glass frit, and the first glass fit cured by laser is formed between the first substrate 110 and the side wall barrier structure 140, for instance. A thermal-setting glass frit made through high-temperature is coated onto the peripheries of a packaging area between the first substrate 110 and the side wall barrier structure 140, and the glass frit surrounds the environmental sensitive electronic device 130. The first substrate 110 and the side wall barrier structure 140 are then adhered to each other by laser melting, so as to block moisture and oxygen.

Figure 2A:
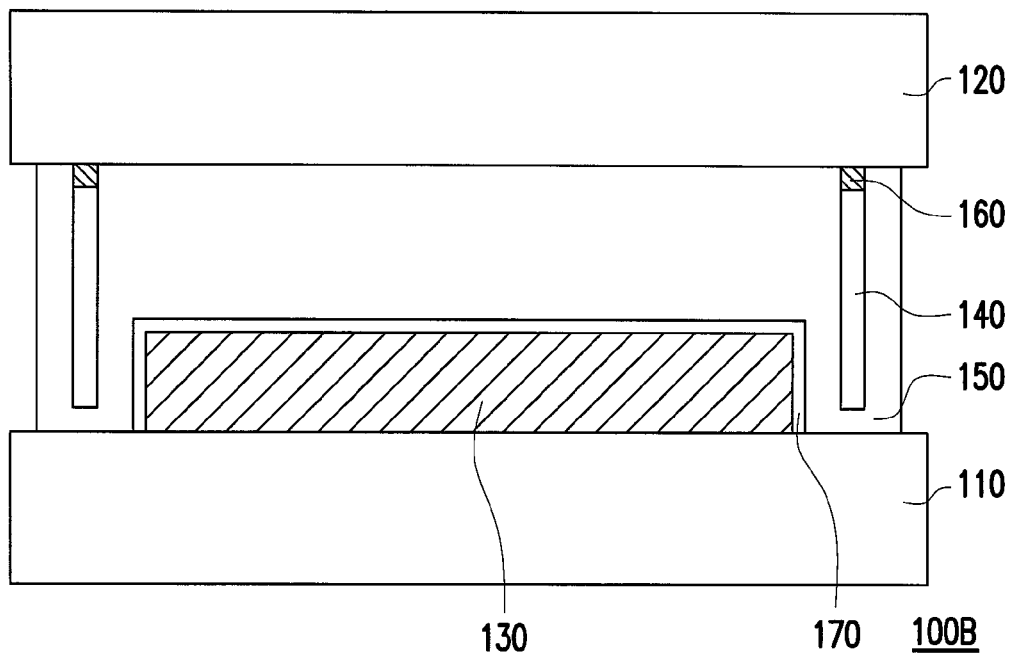
FIG. 2A and FIG. 2B are cross-sectional views illustrating an environmental sensitive electronic device package according to another exemplary embodiment of the disclosure.

FIG. 2A is a cross-sectional view illustrating an environmental sensitive electronic device package according to another exemplary embodiment of the disclosure. The environmental sensitive electronic device package 100B shown in FIG. 2A is similar to the environmental sensitive electronic device package 100A shown in FIG. 1A, while the difference therebetween lies in that the first adhesive 150 of the environmental sensitive electronic device package 100B depicted in FIG. 2A encapsulates the environmental sensitive electronic device 130, the side wall barrier structure 140, the second adhesive 160, and the packaging film 170 and is adhered to the first substrate 110. In another feasible exemplary embodiment, the second adhesive 160 in the environmental sensitive electronic device package 100B depicted in FIG. 2A may be replaced by a second glass frit, and the second glass fit cured by laser is formed between the second substrate 120 and the side wall barrier structure 140 by, for instance. A thermal-setting glass frit made through high-temperature is coated onto the peripheries of a packaging area between the second substrate 120 and the side wall barrier structure 140, and the glass frit surrounds the environmental sensitive electronic device 130. The second substrate 120 and the side wall barrier structure 140 are then adhered to each other by laser melting, so as to block moisture and oxygen.

Figure 2B:
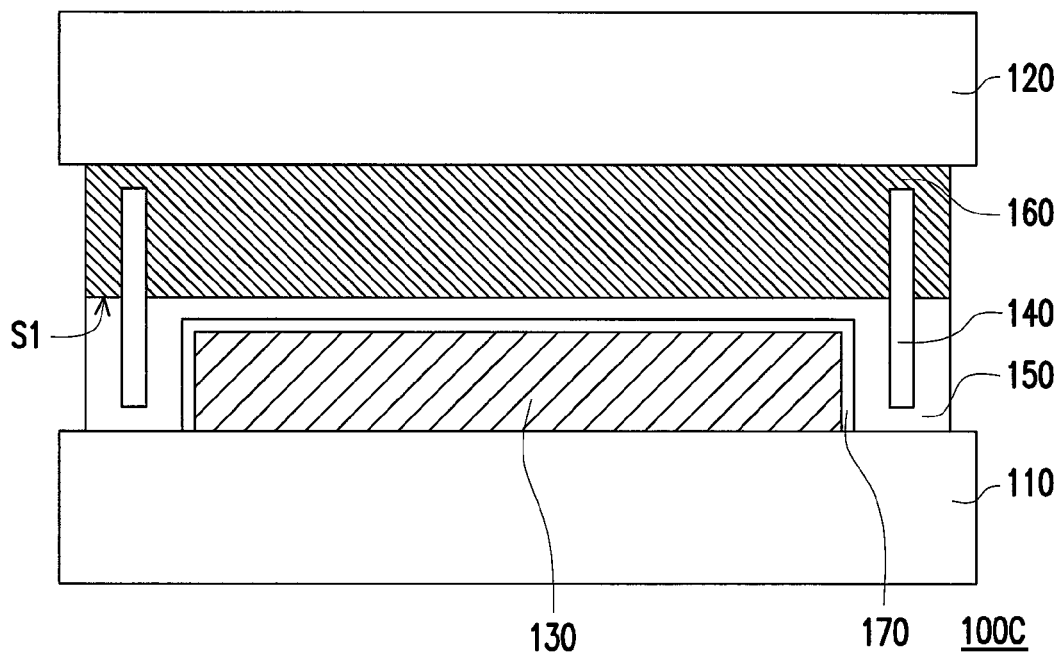

FIG. 2B is a cross-sectional view illustrating an environmental sensitive electronic device package according to another exemplary embodiment of the disclosure. The environmental sensitive electronic device package 100C shown in FIG. 2B is similar to the environmental sensitive electronic device package 100A shown in FIG. 1A, while the difference therebetween lies in that the first adhesive 150 of the environmental sensitive electronic device package 100C depicted in FIG. 2B encapsulates the environmental sensitive electronic device 130, a portion of the side wall barrier structure 140, and the packaging film 170. The second adhesive 160 encapsulates the other portion of the side wall barrier structure 140. Here, the first and second adhesives 150 and 160 are adhered to each other and together define an adhesion surface S1.

Figure 2C:
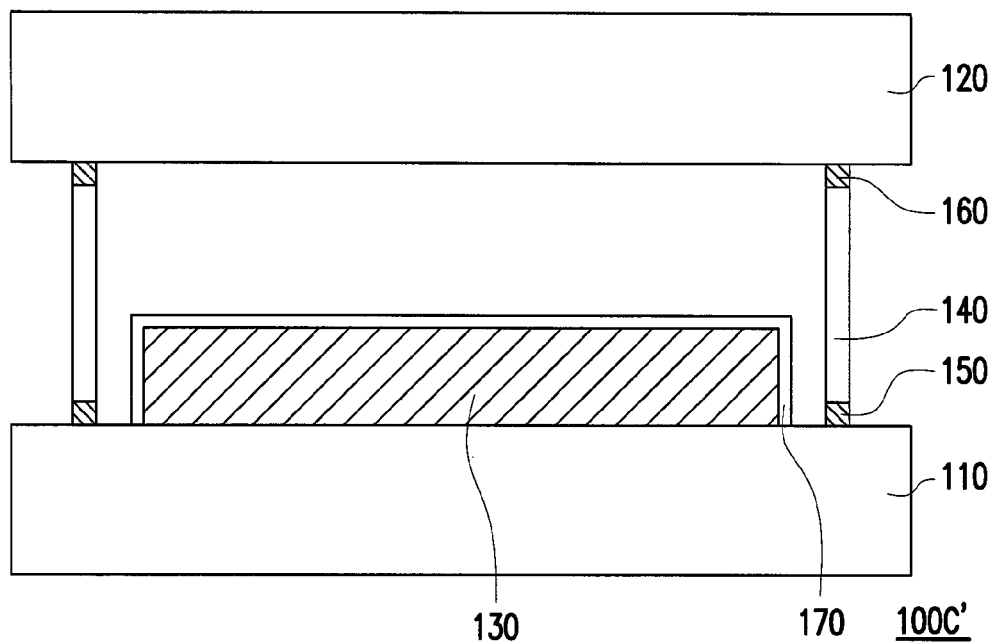
FIG. 2C is a cross-sectional view illustrating an environmental sensitive electronic device package according to another exemplary embodiment of the disclosure.

FIG. 2C is a cross-sectional view illustrating an environmental sensitive electronic device package according to another exemplary embodiment of the disclosure. The environmental sensitive electronic device package 100C' shown in FIG. 2C is similar to the environmental sensitive electronic device package 100C shown in FIG. 2B, while the difference therebetween lies in that the first adhesive 150 of the environmental sensitive electronic device package 100C' is merely coated onto a bonding area between the side wall barrier structure 140 and the first substrate 110, and that the second adhesive 160 of the environmental sensitive electronic device package 100C' is merely coated onto a bonding area between the side wall barrier structure 140 and the second substrate 120. That is, no other fillers or adhesives are located between the first and second substrates 110 and 120. In other embodiments, the first adhesive 150 and the second adhesive 160 may be respectively replaced by the first glass frit and the second glass frit. The first glass fit is, for instance, formed between the first substrate 110 and the side wall barrier structure 140 by applying a packaging technique with use of a laser melting adhesive, and the second glass frit is, for instance, formed between the second substrate 120 and the side wall barrier structure 140 by applying a packaging technique with use of a laser melting adhesive. Thereby, the side wall barrier structure 140 is tightly bonded to the first substrate 110 and the second substrate 120, so as to block moisture and oxygen.

Figure 3A:
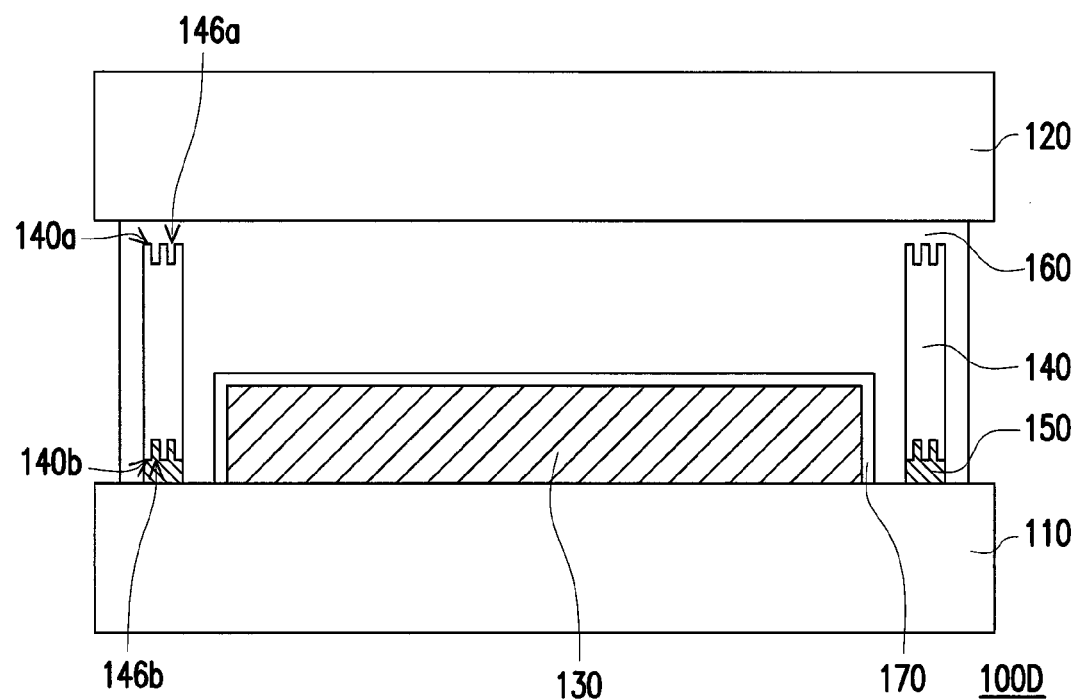
FIG. 3A is a cross-sectional view illustrating an environmental sensitive electronic device package according to another exemplary embodiment of the disclosure.

FIG. 3A is a cross-sectional view illustrating an environmental sensitive electronic device package according to another exemplary embodiment of the disclosure. The environmental sensitive electronic device package 100D shown in FIG. 3A is similar to the package 100A shown in FIG. 1A, while the difference therebetween lies in that the side wall barrier structure 140 of the environmental sensitive electronic device package 100D shown in FIG. 3A may further include trenches 146a and 146b respectively located on a top surface 140a and a bottom surface 140b of the side wall barrier structure 140. The top surface 140a faces the second substrate 120, and the bottom surface 140b faces the first substrate 110. The trench 146b located on the bottom surface 140b is filled with the first adhesive 150 between the bottom surface 140b and the first substrate 110, and the trench 146a located on the top surface 140a is filled with the second adhesive 160 between the top surface 140a and the second substrate 120. In other exemplary embodiments of the disclosure not shown herein, the side wall barrier structure 140 may have the trench 146a located on the top surface 140a or the trench 146b located on the bottom surface 140b, which should not be construed as a limitation to the disclosure. In another exemplary embodiment, the first adhesive 150 in the environmental sensitive electronic device package 100D depicted in FIG. 3A may be replaced by a first glass fit, and the first glass frit cured by laser is formed between the first substrate 110 and the side wall barrier structure 140, for instance.

Figure 3B:
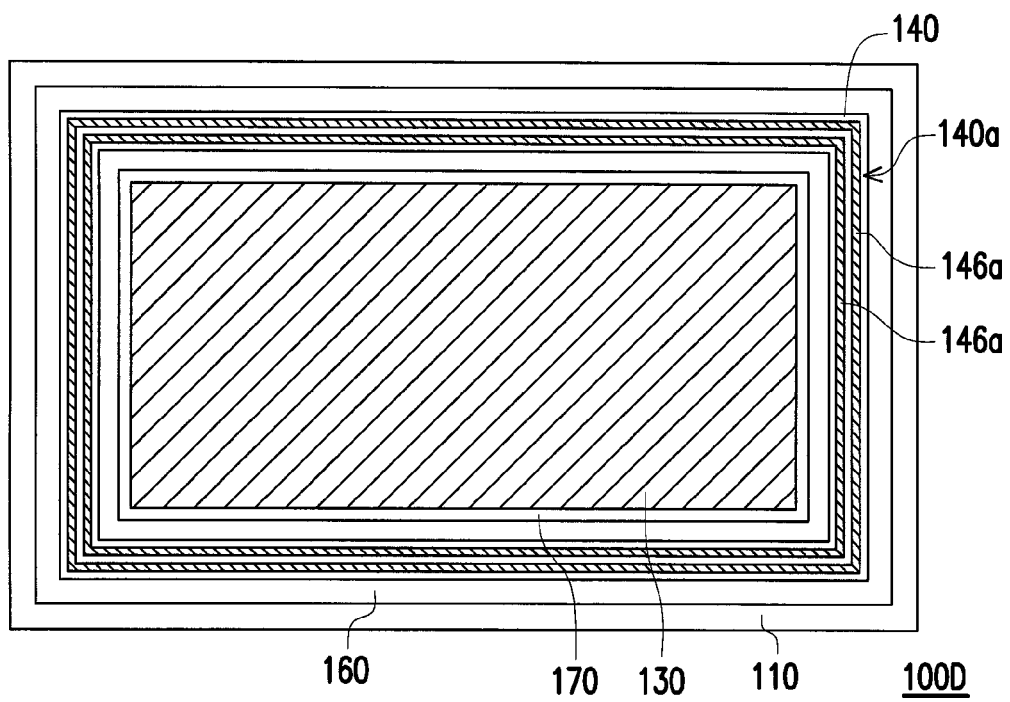
FIG. 3B and FIG. 3C are top views illustrating the environmental sensitive electronic device package depicted in FIG. 3A.
Figure 3C:
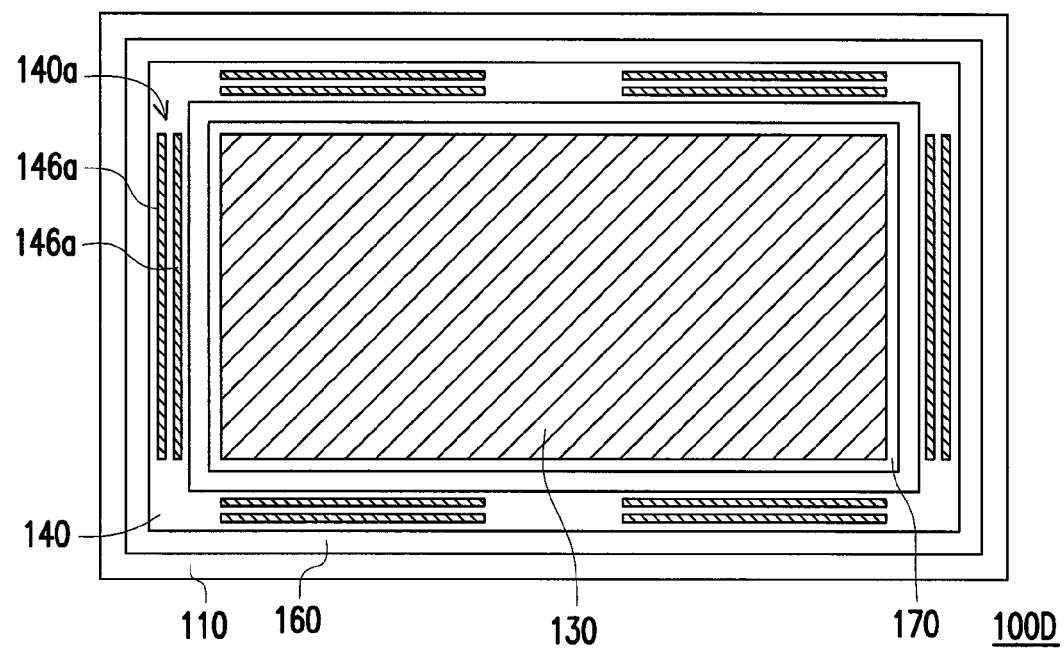

FIG. 3B and FIG. 3C are top views illustrating the environmental sensitive electronic device package depicted in FIG. 3A. With reference to FIG. 3B, in the present exemplary embodiment, the trench 146a located on the top surface 140a of the side wall barrier structure 140 is a closed trench, for instance. With reference to FIG. 3C, in the present exemplary embodiment, the trench 146a located on the top surface 140a of the side wall barrier structure 140 may also be a plurality of separated linear trenches, for instance.

Figure 3D:
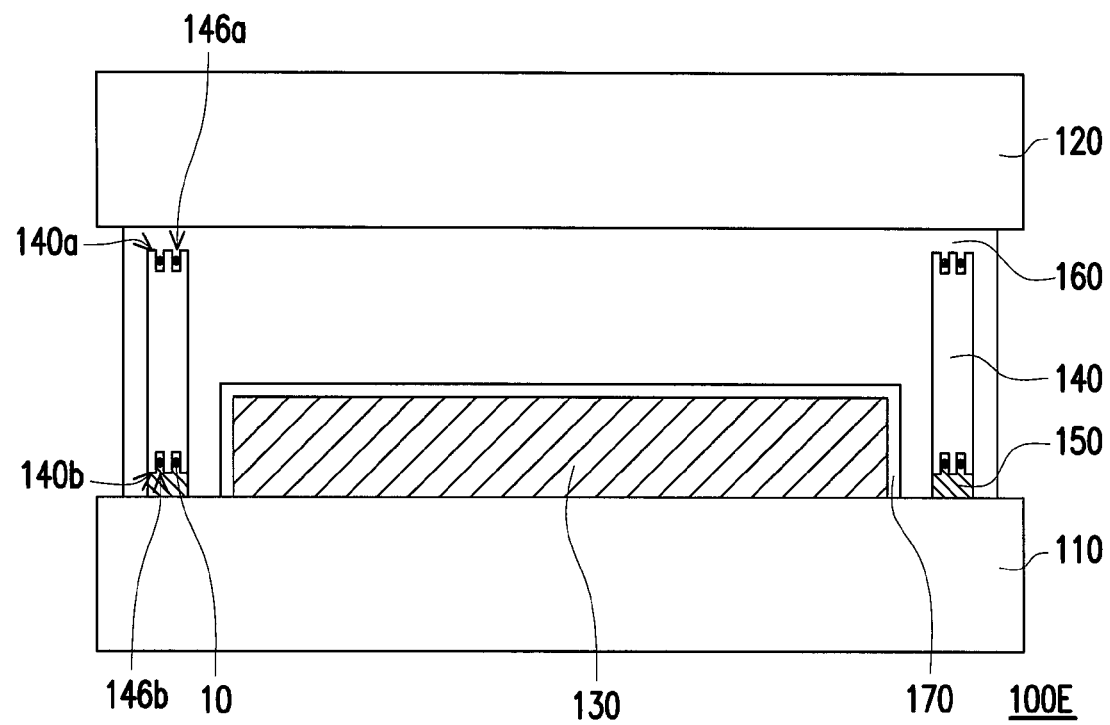
FIG. 3D is a cross-sectional view illustrating an environmental sensitive electronic device package according to another exemplary embodiment of the disclosure.

FIG. 3D is a cross-sectional view illustrating an environmental sensitive electronic device package according to another exemplary embodiment of the disclosure. The environmental sensitive electronic device package 100E shown in FIG. 3D is similar to the package 100D shown in FIG. 3A, while the difference therebetween lies in that the trench 146a on the top surface 140a and the trench 146b on the bottom surface 140b of the side wall barrier structure 140 of the environmental sensitive electronic device package 100E shown in FIG. 3D further include a moisture absorbent 10. The moisture absorbent 10 includes alkaline-earth oxide and thus may effectively improve the ability of the environmental sensitive electronic device package 100E to block moisture and oxygen. In another aspect, the trench 146b located on the bottom surface 140b is filled with the first adhesive 150 between the bottom surface 140b and the first substrate 110, and the trench 146a located on the top surface 140a is filled with the second adhesive 160 between the top surface 140a and the second substrate 120, and the first adhesive 150 and the second adhesive 160 encapsulate the moisture absorbent 10 in the trenches 146a and 146b. In other exemplary embodiments of the disclosure not shown herein, the moisture absorbent 10 may be selectively located in the trench 146a on the top surface 140a or in the trench 146b on the bottom surface 140b, which should not be construed as a limitation to the disclosure. In another exemplary embodiment, the first adhesive 150 in the environmental sensitive electronic device package 100E depicted in FIG. 3D may be replaced by a first glass frit, and the first glass frit cured by laser is formed between the first substrate 110 and the side wall barrier structure 140, for instance.

Figure 4A:
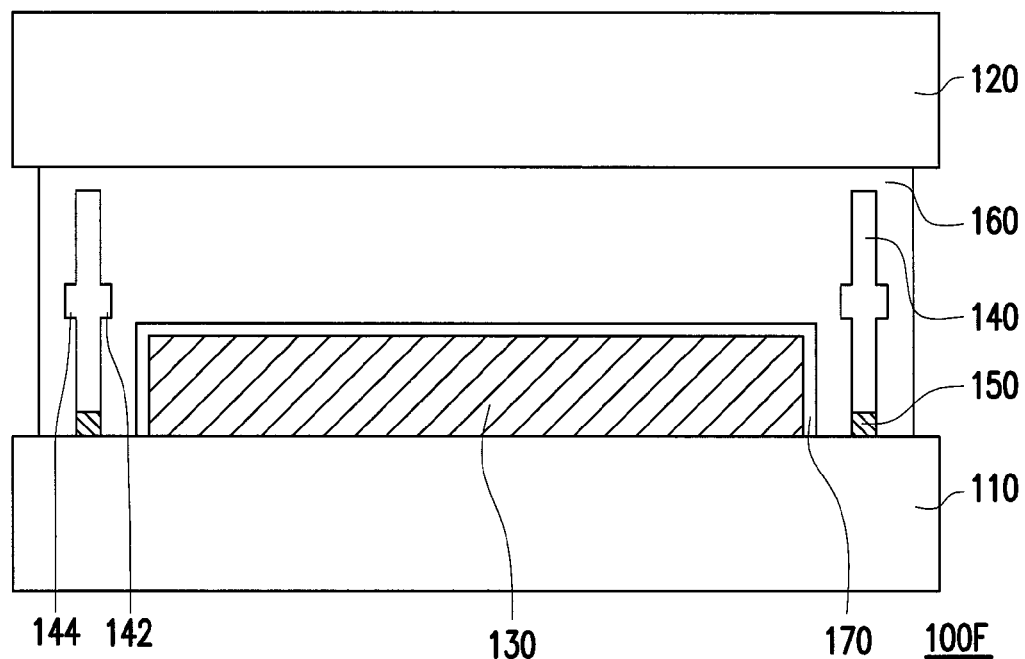
FIG. 4A to FIG. 4C are cross-sectional views illustrating an environmental sensitive electronic device package according to another exemplary embodiment of the disclosure.

FIG. 4A is a cross-sectional view illustrating an environmental sensitive electronic device package according to another exemplary embodiment of the disclosure. The environmental sensitive electronic device package 100F shown in FIG. 4A is similar to the package 100A shown in FIG. 1A, while the difference therebetween lies in that the side wall barrier structure 140 of the environmental sensitive electronic device package 100F shown in FIG. 4A may further include lateral extension structures 142 and 144 that respectively extend toward and against the environmental sensitive electronic device 130, and the lateral extension structures 142 and 144 may simultaneously be formed on two sides of the side wall barrier structure 140, so as to expand the bonding area between the side wall barrier structure 140 and the second adhesive 160. In the present exemplary embodiment, the lateral extension structures 142 and 144 are encapsulated by the second adhesive 160 and in principle do not extend across the environmental sensitive electronic device 130. In other exemplary embodiments of the disclosure not shown herein, the side wall barrier structure 140 may have the lateral extension structure 142 extending toward the environmental sensitive electronic device 130 or the lateral extension structure 144 extending against the environmental sensitive electronic device 130, which should not be construed as a limitation to the disclosure. In another exemplary embodiment, the first adhesive 150 in the environmental sensitive electronic device package 100F depicted in FIG. 4A may be replaced by a first glass fit, and the first glass frit cured by laser is formed between the first substrate 110 and the side wall barrier structure 140, for instance.

Figure 4B:
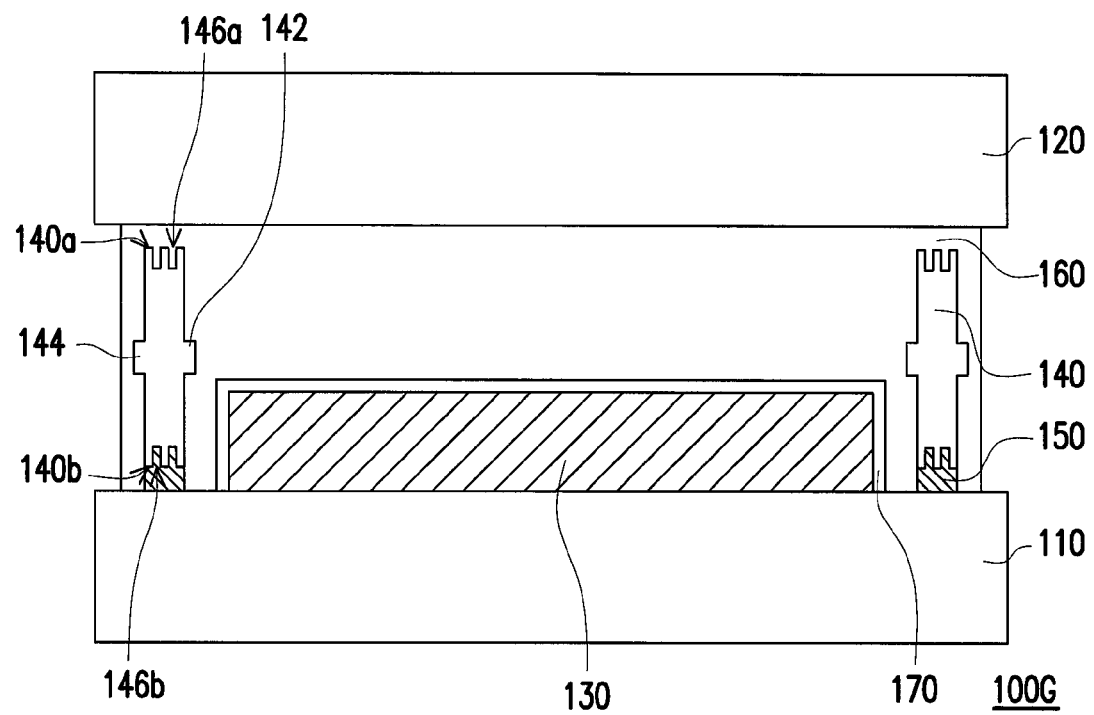

FIG. 4B is a cross-sectional view illustrating an environmental sensitive electronic device package according to another exemplary embodiment of the disclosure. The environmental sensitive electronic device package 100G shown in FIG. 4B is similar to the package 100F shown in FIG. 4A, while the difference therebetween lies in that the side wall barrier structure 140 of the environmental sensitive electronic device package 100G shown in FIG. 4B may further include trenches 146a and 146b respectively located on a top surface 140a and a bottom surface 140b of the side wall barrier structure 140. The trench 146b located on the bottom surface 140b is filled with the first adhesive 150 between the bottom surface 140b and the first substrate 110, and the trench 146a located on the top surface 140a is filled with the second adhesive 160 between the top surface 140a and the second substrate 120. In other exemplary embodiments of the disclosure not shown herein, the side wall barrier structure 140 may have the trench 146a located on the top surface 140a or the trench 146b located on the bottom surface 140b, which should not be construed as a limitation to the disclosure.

In another exemplary embodiment, the first adhesive 150 in the environmental sensitive electronic device package 100G depicted in FIG. 4B may be replaced by a first glass frit, and the first glass fit cured by laser is formed between the first substrate 110 and the side wall barrier structure 140, for instance.

Figure 4C:
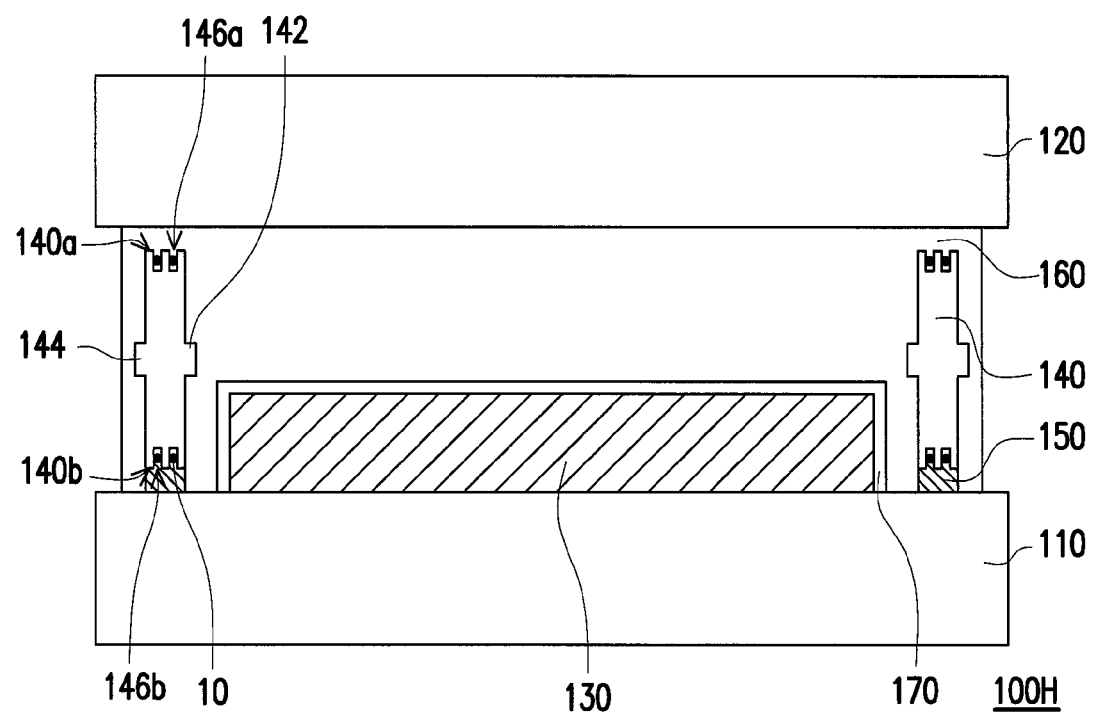

FIG. 4C is a cross-sectional view illustrating an environmental sensitive electronic device package according to another exemplary embodiment of the disclosure. The environmental sensitive electronic device package 100H shown in FIG. 4C is similar to the package 100G shown in FIG. 4B, while the difference therebetween lies in that the trench 146a on the top surface 140a and the trench 146b on the bottom surface 140b of the side wall barrier structure 140 of the environmental sensitive electronic device package 100H shown in FIG. 4C further include a moisture absorbent 10. The moisture absorbent 10 includes alkaline-earth oxide and thus may effectively improve the ability of the environmental sensitive electronic device package 100H to block moisture and oxygen. In another aspect, the trench 146b located on the bottom surface 140b is filled with the first adhesive 150 between the bottom surface 140b and the first substrate 110, and the trench 146a located on the top surface 140a is filled with the second adhesive 160 between the top surface 140a and the second substrate 120, and the first adhesive 150 and the second adhesive 160 encapsulate the moisture absorbent 10 in the trenches 146a and 146b. In other exemplary embodiments of the disclosure not shown herein, the moisture absorbent 10 may be selectively located in the trench 146a on the top surface 140a or in the trench 146b on the bottom surface 140b, which should not be construed as a limitation to the disclosure.

In another exemplary embodiment, the first adhesive 150 in the environmental sensitive electronic device package 100H depicted in FIG. 4C may be replaced by a first glass frit, and the first glass frit cured by laser is formed between the first substrate 110 and the side wall barrier structure 140, for instance.

Manufacturing methods of different types of environmental sensitive electronic device packages are described hereinafter with reference to FIG. 5A to FIG. 5D. The same or similar reference numbers used in each of the following exemplary embodiments represent the same or the like elements, and thus descriptions of the same or the like elements will not be repeatedly provided hereinafter.

Figure 5A:
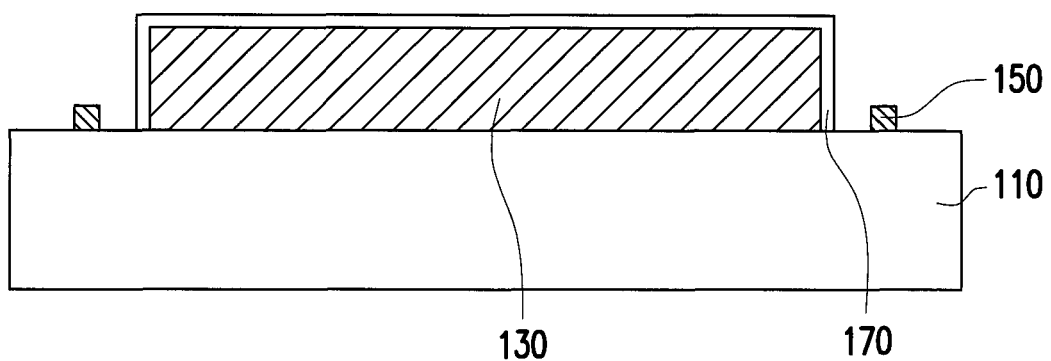
FIG. 5A to FIG. 5D are schematic cross-sectional views illustrating a manufacturing method of an environmental sensitive electronic device package according to an exemplary embodiment of the disclosure.

FIG. 5A to FIG. 5D are schematic cross-sectional views illustrating a manufacturing method of an environmental sensitive electronic device package according to an exemplary embodiment of the disclosure. With reference to FIG. 5A, a first adhesive 150 is formed on a first substrate 110, and the first substrate 110 has an environmental sensitive electronic device 130 thereon. In the present exemplary embodiment, the first adhesive 150 is provided by a dispensing head (not shown) and is coated onto the first substrate 110, for instance. The environmental sensitive electronic device 130 is adhered to the first substrate 110 through an optical adhesive (not shown), for instance. Besides, before the first adhesive 150 is coated onto the first substrate 110, a packaging film 170 is formed on the environmental sensitive electronic device 130, and the packaging film 170 encapsulates the environmental sensitive electronic device 130.

Figure 5B:
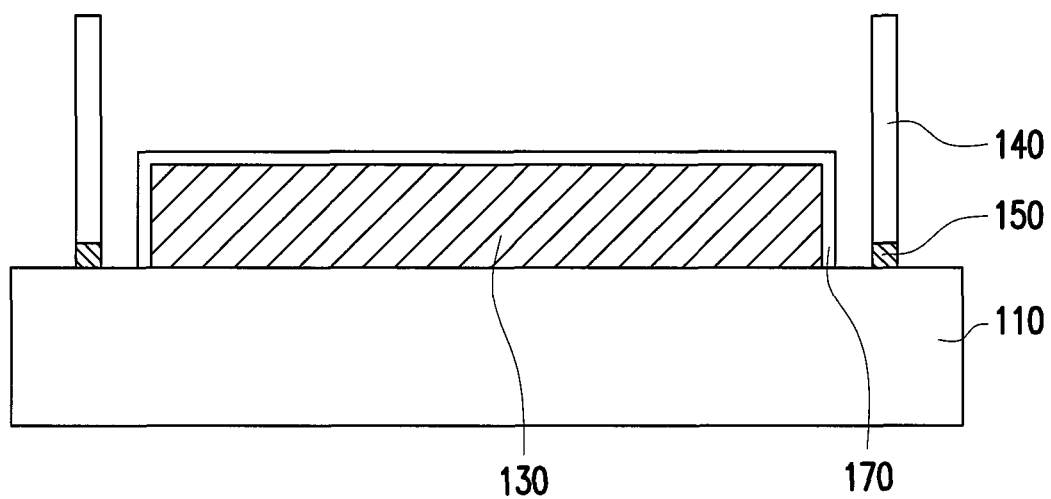

As shown in FIG. 5B, a side wall barrier structure 140 is disposed on the first adhesive 150. The side wall barrier structure 140 is adhered to the first substrate 110 through the first adhesive 150 and surrounds the environmental sensitive electronic device 130. In the present exemplary embodiment, the side wall barrier structure 140 is picked up by a fixture (not shown) and is tightly adhered to the first adhesive 150 by pressure. The first adhesive 150 is cured by heat or ultraviolet light, such that the first substrate 110 and the side wall barrier structure 140 are tightly adhered to each other. According to the present exemplary embodiment, a cross-section of the side wall barrier structure 140 is shaped as a rectangle, for instance; the shape of the cross-section of the side wall barrier structure 140 may also be a polygonal shape, a circular shape, or an elliptic shape. Besides, the side wall barrier structure 140 has a thickness T1 that is smaller than or substantially equal to 1 mm.

Figures 1, 5B:
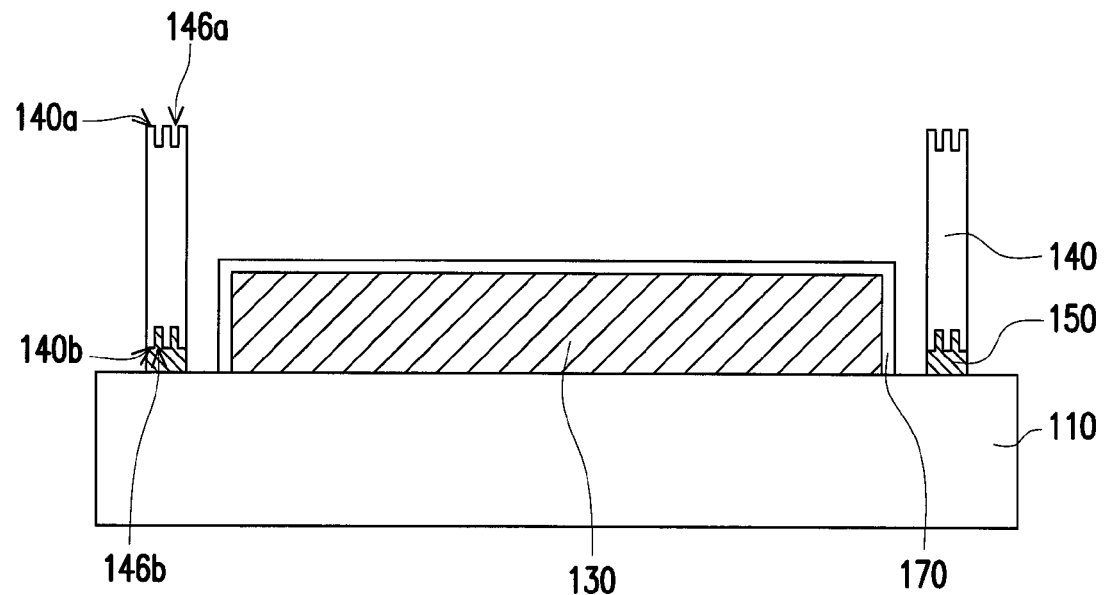
Figures 2, 5B:
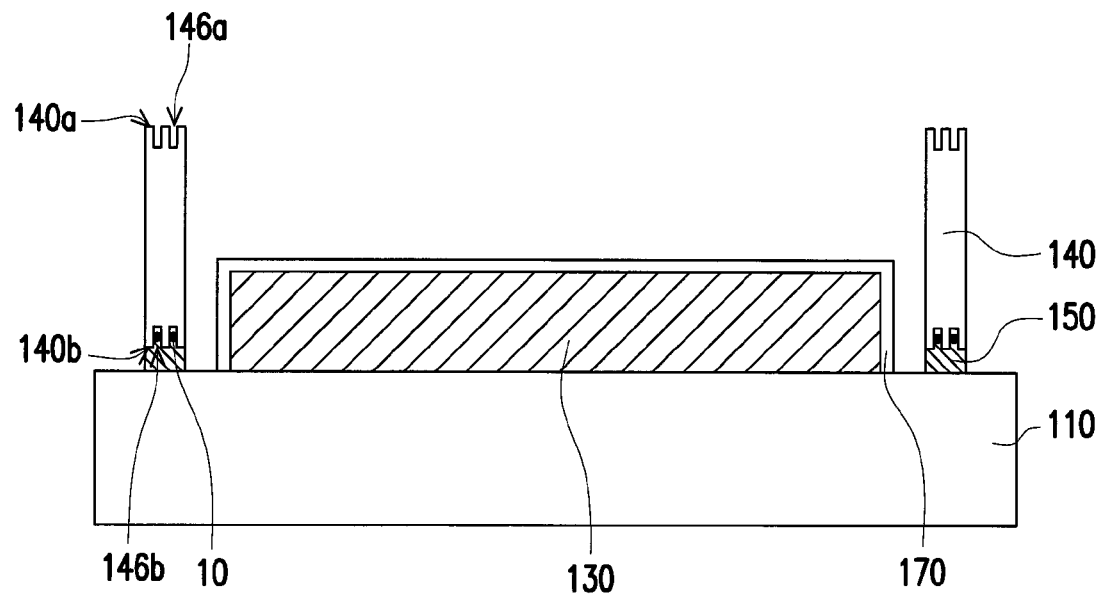
Figures 3, 5B:
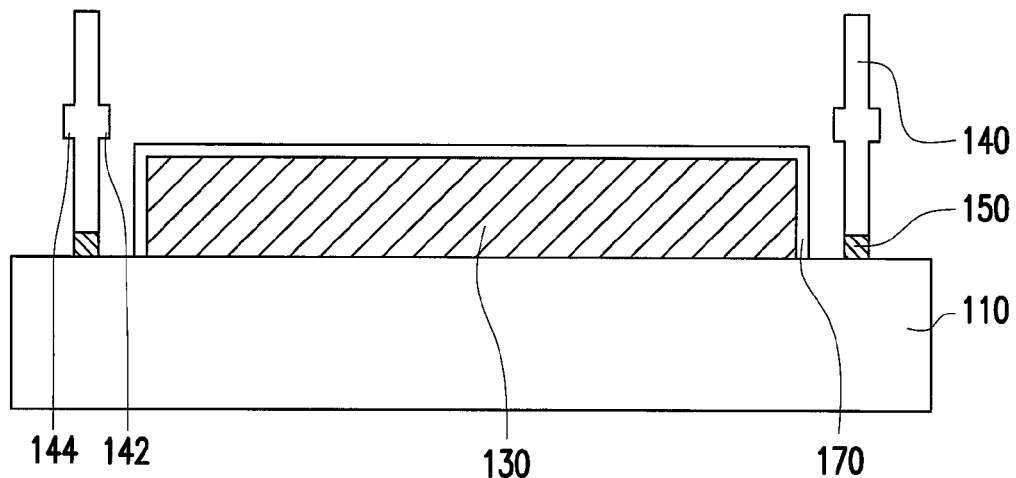
Figures 4, 5B:
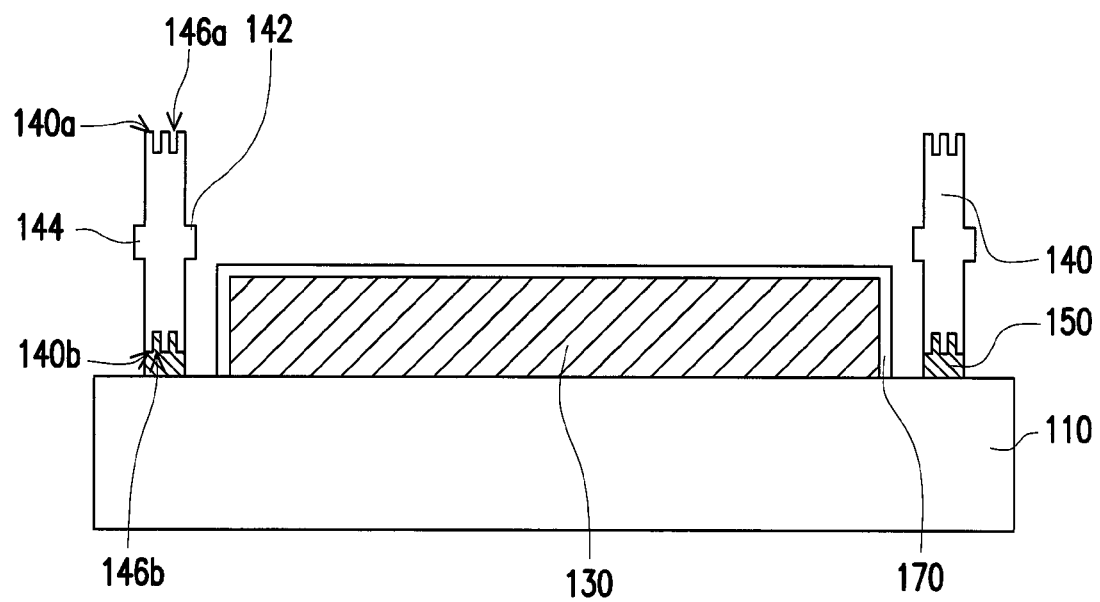
Figures 5, 5B:
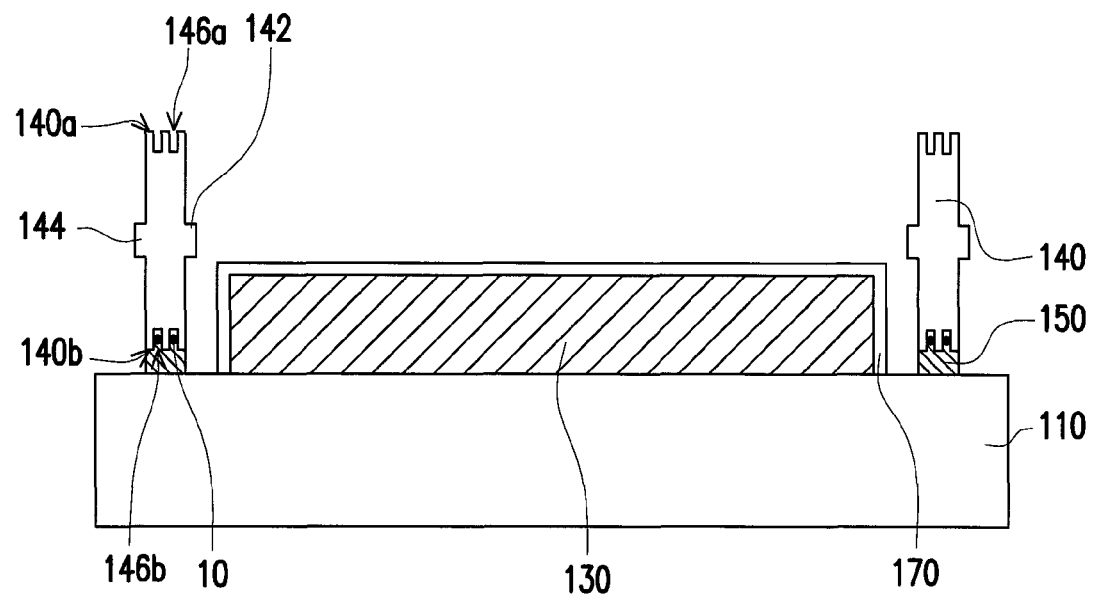
Figure 5C:
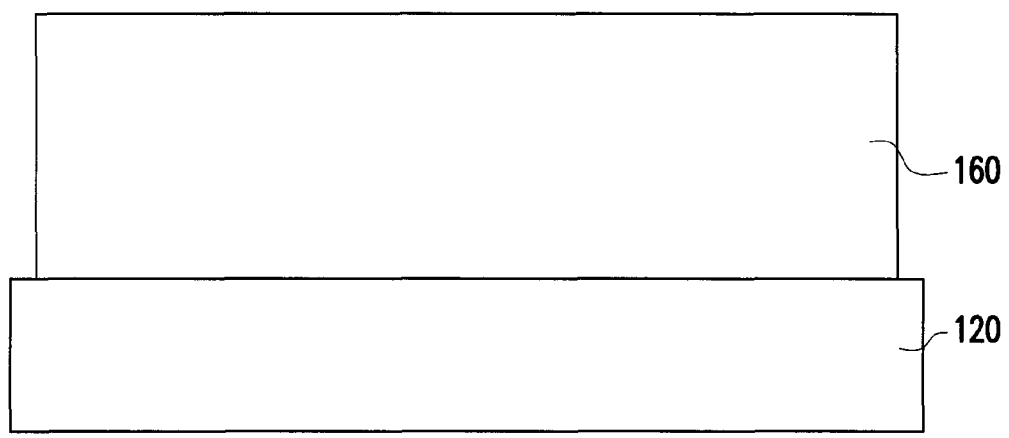
Figure 5D:
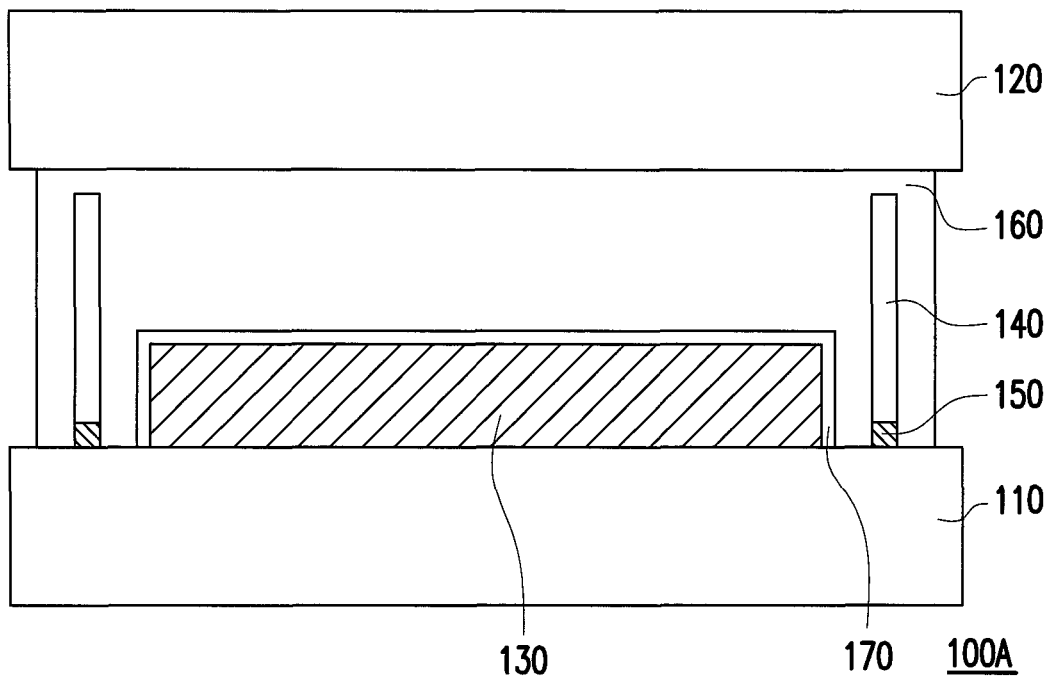

As shown in FIG. 5C and FIG. 5D, a second adhesive 160 is formed on a second substrate 120. The second substrate 120 and the side wall barrier structure 140 are bonded together through the second adhesive 160, and the side wall barrier structure 140, the first adhesive 150, and the second adhesive 160 are located between the first substrate 110 and the second substrate 120. In the present exemplary embodiment, the second adhesive 160 is provided by a dispensing head (not shown) and is coated onto the second substrate 120, for instance. After the second adhesive 160 is coated onto the second substrate 120, the second substrate 120 is tightly bonded to the side wall barrier structure 140 through the second adhesive 160 by frame press, for instance. So far, the environmental sensitive electronic device package 100A is substantially formed. The second adhesive 160 is cured by heat or ultraviolet light, such that the second substrate 120 and the side wall barrier structure 140 are tightly bonded together. The first adhesive 150 located between the side wall barrier structure 140 and the first substrate 110 has a thickness T2, and the second adhesive 160 located between the side wall barrier structure 140 and the second substrate 120 has a thickness T3. Each of the thicknesses T2 and T3 is smaller than 15 um.

The side wall barrier structure 140 described herein is made of an organic material, an inorganic material, or a combination thereof, for instance. Said materials may be rolled, molded, or stretched to form a sheet-shaped structure, and the sheet-shaped structure is further etched, transfer-printed, squeezed, or punched, so as to form a closed structure, as shown in FIG. 1B. In another embodiment, the side wall barrier structure 140 may be a closed structure formed by molding.

In the previous exemplary embodiment, the manufacturing method of the environmental sensitive electronic device package 100A is described. In other exemplary embodiments, the manufacturing method of the environmental sensitive electronic device package may vary in response to different types of side wall barrier structures.

With reference to FIG. 5B-1, the difference between the side wall barrier structure 140 shown in FIG. 5B-1 and that shown in FIG. 5B lies in that at least one trench 146a/146b is formed on the top surface 140a/the bottom surface 140b of the side wall barrier structure 140 shown in FIG. 5B-1 by etching. In the process of adhering the side wall barrier structure 140 to the first substrate 110 through the first adhesive 150, the trench 146b located on the bottom surface 146b is filled with the first adhesive 150.

As shown in FIG. 5C, the second adhesive 160 is formed on the second substrate 120. The second substrate 120 and the side wall barrier structure 140 are bonded together through the second adhesive 160, and the side wall barrier structure 140, the first adhesive 150, and the second adhesive 160 are located between the first substrate 110 and the second substrate 120. So far, the environmental sensitive electronic device package 100D shown in FIG. 3A is substantially formed. In particular, while the second substrate 120 and the side wall barrier structure 140 are bonded through the second adhesive 160, the trench 146a on the top surface 140a is filled with the second adhesive 160.

With reference to FIG. 5B-2, the difference between the side wall barrier structure 140 shown in FIG. 5B-2 and that shown in FIG. 5B lies in that at least one trench 146a/146b is formed on the top surface 140a/the bottom surface 140b of the side wall barrier structure 140 shown in FIG. 5B-2 by etching. Before the side wall barrier structure 140 is adhered to the first substrate 110 through the first adhesive 150, the moisture absorbent 10 is disposed in the trench 146b located on the bottom surface 146b of the side wall barrier structure 140. To be specific, while the side wall barrier structure 140 is adhered to the first substrate 110 through the first adhesive 150, the trench 146b is filled with the first adhesive 150, and the first adhesive 150 encapsulates the moisture absorbent 10 in the trench 146b.

As shown in FIG. 5C, the second adhesive 160 is formed on the second substrate 120. The second substrate 120 and the side wall barrier structure 140 are bonded together through the second adhesive 160, and the side wall barrier structure 140, the first adhesive 150, and the second adhesive 160 are located between the first substrate 110 and the second substrate 120. So far, the environmental sensitive electronic device package 100E shown in FIG. 3D is substantially formed. Before the second adhesive 160 is formed on the second substrate 120 and is applied to adhere the second substrate 120 and the side wall barrier structure 140, the moisture absorbent 10 is disposed in the trench 146a on the top surface 140a of the side wall barrier structure 140. While the second substrate 120 and the side wall barrier structure 140 are bonded through the second adhesive 160, the trench 146a on the top surface 140a is filled with the second adhesive 160, and the second adhesive 160 encapsulates the moisture absorbent 10 in the trench 146a.

With reference to FIG. 5B-3, the difference between the side wall barrier structure 140 shown in FIG. 5B-3 and that shown in FIG. 5B lies in that the side barrier structure 140 shown in FIG. 5B-3 has the lateral extension structures 142 and 144 that are formed on two sides of the side wall barrier structure 140 by etching, for instance. The lateral extension structures 142 and 144 respectively extend toward and against the environmental sensitive electronic device 130, and the lateral extension structures 142 do not extend across the environmental sensitive electronic device 130. In other exemplary embodiments of the disclosure not shown herein, the side wall barrier structure 140 may have the lateral extension structure 142 extending toward the environmental sensitive electronic device 130 or the lateral extension structure 144 extending against the environmental sensitive electronic device 130, which should not be construed as a limitation to the disclosure.

As shown in FIG. 5C, the second adhesive 160 is formed on the second substrate 120. The second substrate 120 and the side wall barrier structure 140 are bonded together through the second adhesive 160, and the side wall barrier structure 140, the first adhesive 150, and the second adhesive 160 are located between the first substrate 110 and the second substrate 120. So far, the environmental sensitive electronic device package 100F shown in FIG. 4A is substantially formed. The second adhesive 160 described herein further encapsulates the lateral extension structures 142 and 144.

With reference to FIG. 5B-4, the difference between the side wall barrier structure 140 shown in FIG. 5B-4 and that shown in FIG. 5B lies in that at least one trench 146a/146b is formed on the top surface 140a/the bottom surface 140b of the side wall barrier structure 140 shown in FIG. 5B-4 by etching, and the side barrier structure 140 shown in FIG. 5B-4 may also have the lateral extension structures 142 and 144 that are formed on two sides of the side wall barrier structure 140 by etching, for instance. While the side wall barrier structure 140 is adhered to the first substrate 110 through the first adhesive 150, the trench 146b is filled with the first adhesive 150.

As shown in FIG. 5C, the second adhesive 160 is formed on the second substrate 120. The second substrate 120 and the side wall barrier structure 140 are bonded together through the second adhesive 160, and the side wall barrier structure 140, the first adhesive 150, and the second adhesive 160 are located between the first substrate 110 and the second substrate 120. So far, the environmental sensitive electronic device package 100G shown in FIG. 4B is substantially formed. While the second substrate 120 and the side wall barrier structure 140 are bonded through the second adhesive 160, the trench 146a on the top surface 140a is filled with the second adhesive 160. Besides, the second adhesive 160 further encapsulates the lateral extension structures 142 and 144.

With reference to FIG. 5B-5, the difference between the side wall barrier structure 140 shown in FIG. 5B-5 and that shown in FIG. 5B lies in that at least one trench 146a/146b is formed on the top surface 140a/the bottom surface 140b of the side wall barrier structure 140 shown in FIG. 5B-5 by etching, and the side barrier structure 140 shown in FIG. 5B-5 may also have the lateral extension structures 142 and 144 that are formed on two sides of the side wall barrier structure 140 by etching, for instance. Additionally, before the side wall barrier structure 140 is adhered to the first substrate 110 through the first adhesive 150, the moisture absorbent 10 is disposed in the trench 146b on the bottom surface 140b of the side wall barrier structure 140 To be specific, while the side wall barrier structure 140 is adhered to the first substrate 110 through the first adhesive 150, the trench 146b is filled with the first adhesive 150, and the first adhesive 150 encapsulates the moisture absorbent 10 in the trench 146b.

As shown in FIG. 5C, the second adhesive 160 is formed on the second substrate 120. The second substrate 120 and the side wall barrier structure 140 are bonded together through the second adhesive 160, and the side wall barrier structure 140, the first adhesive 150, and the second adhesive 160 are located between the first substrate 110 and the second substrate 120. So far, the environmental sensitive electronic device package 100H shown in FIG. 4C is substantially formed. Before the second adhesive 160 is formed on the second substrate 120 and is applied to adhere the second substrate 120 and the side wall barrier structure 140, the moisture absorbent 10 is disposed in the trench 146a on the top surface 140a of the side wall barrier structure 140. The trench 146a on the top surface 140a is filled with the second adhesive 160, and the second adhesive 160 encapsulates the moisture absorbent 10 in the trench 146a. Besides, the second adhesive 160 further encapsulates the lateral extension structures 142 and 144.

As shown in FIG. 1A, FIG. 2A, and FIG. 2B, the first and second adhesives 150 and 160 of the environmental sensitive electronic device packages 100A to 100C are respectively distributed on the first and second substrates 110 and 120 in different manner; that is, the manufacturing method of the environmental sensitive electronic device package may vary in response to different manner in which the adhesives are distributed. In the following exemplary embodiments, the manufacturing methods of the environmental sensitive electronic device packages 100A and 100C are elaborated.

Figure 6A:
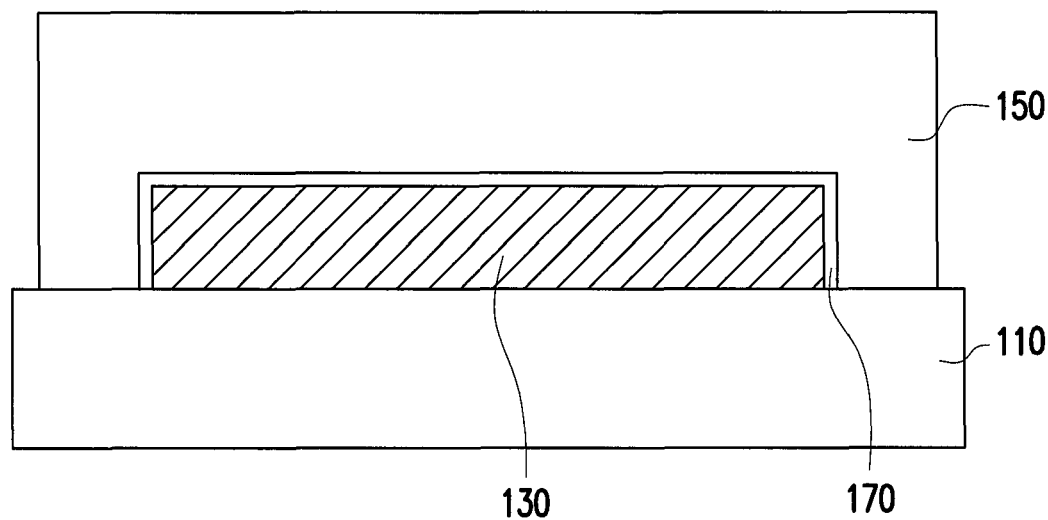
FIG. 6A to FIG. 6C are schematic cross-sectional views illustrating a manufacturing method of an environmental sensitive electronic device package according to another exemplary embodiment of the disclosure.
Figure 6B:
Figure 6C:
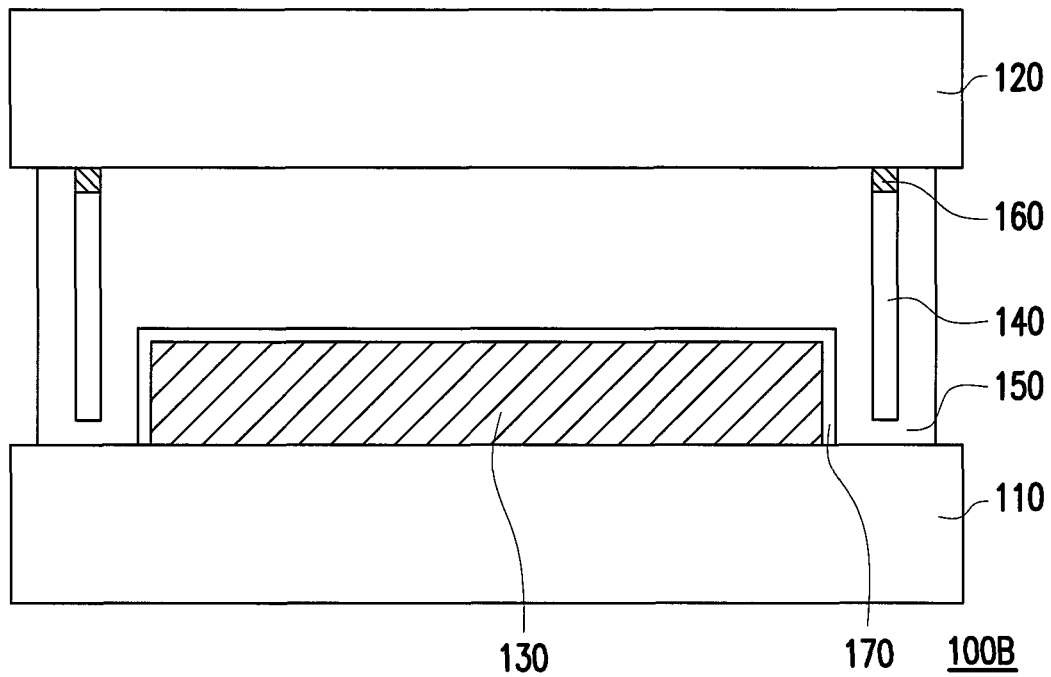

FIG. 6A to FIG. 6C are schematic cross-sectional views illustrating a manufacturing method of an environmental sensitive electronic device package according to another exemplary embodiment of the disclosure. With reference to FIG. 6A, a first adhesive 150 is formed on a first substrate 110, and the first substrate 110 has an environmental sensitive electronic device 130 thereon. In the present exemplary embodiment, the first adhesive 150 is provided by a dispensing head (not shown) and is coated onto the first substrate 110, for instance, and the first adhesive 150 encapsulates the environmental sensitive electronic device 130. The environmental sensitive electronic device 130 is adhered to the first substrate 110 through an optical adhesive (not shown), for instance. Besides, before the first adhesive 150 is coated onto the first substrate 110, a packaging film 170 is formed on the environmental sensitive electronic device 130, and the packaging film 170 encapsulates the environmental sensitive electronic device 130.

As shown in FIG. 6B, a second adhesive 160 is formed on a second substrate 120, and the second substrate 120 is bonded to the side wall barrier structure 140 through the second adhesive 160. The second adhesive 160 is provided by a dispensing head (not shown) and is coated onto the second substrate 120, for instance. After the second substrate 120 is coated with the second adhesive 160, the side wall barrier structure 140 is picked up by a fixture (not shown) and is tightly adhered to the second adhesive 160 by pressure, for instance. The second adhesive 160 is cured by heat or ultraviolet light, such that the second substrate 120 and the side wall barrier structure 140 are tightly adhered to each other.

As shown in FIG. 6C, the side wall barrier structure 140 is disposed on the first adhesive 150. The side wall barrier structure 140 is adhered to the first substrate 110 through the first adhesive 150 and surrounds the environmental sensitive electronic device 130. Here, the side wall barrier structure 140, the first adhesive 150, and the second adhesive 160 are located between the first substrate 110 and the second substrate 120. In particular, through the frame press of the second substrate 120, the side wall barrier structure 140 is tightly bonded to the first adhesive 150 on the first substrate 110, for instance. So far, the environmental sensitive electronic device package 100B is substantially formed. The second adhesive 160 is cured by heat or ultraviolet light, such that the second substrate 120 and the side wall barrier structure 140 are tightly bonded together. Namely, the first adhesive 150 of the environmental sensitive electronic device package 100C shown in FIG. 6C encapsulates the environmental sensitive electronic device 130, the side wall barrier structure 140, the second adhesive 160, and the packaging film 170 and is then adhered to the second substrate 120.

Figure 7A:
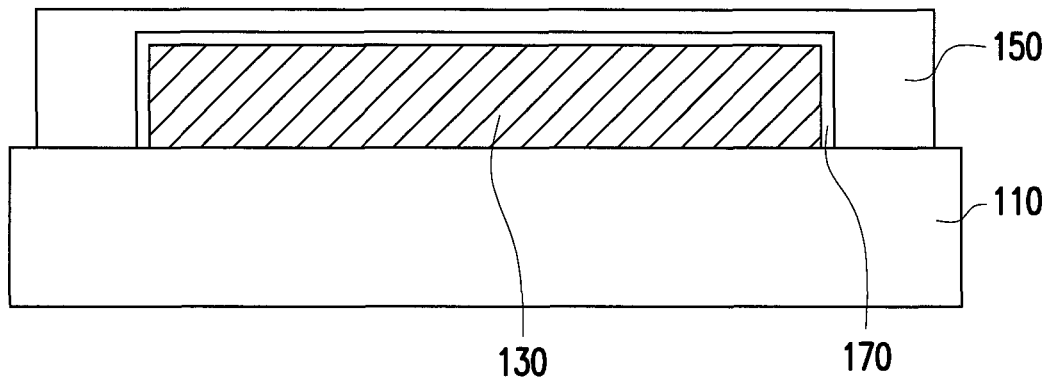
FIG. 7A to FIG. 7D are schematic cross-sectional views illustrating a manufacturing method of an environmental sensitive electronic device package according to another exemplary embodiment of the disclosure.

FIG. 7A to FIG. 7D are schematic cross-sectional views illustrating a manufacturing method of an environmental sensitive electronic device package according to another exemplary embodiment of the disclosure. With reference to FIG. 7A, a first adhesive 150 is formed on a first substrate 110, and the first substrate 110 has an environmental sensitive electronic device 130 thereon. In the present exemplary embodiment, the first adhesive 150 is provided by a dispensing head (not shown) and is coated onto the first substrate 110, for instance, and the first adhesive 150 encapsulates the environmental sensitive electronic device 130. The environmental sensitive electronic device 130 is adhered to the first substrate 110 through an optical adhesive (not shown), for instance. Besides, before the first adhesive 150 is coated onto the first substrate 110, a packaging film 170 is formed on the environmental sensitive electronic device 130, and the packaging film 170 encapsulates the environmental sensitive electronic device 130.

Figure 7B:
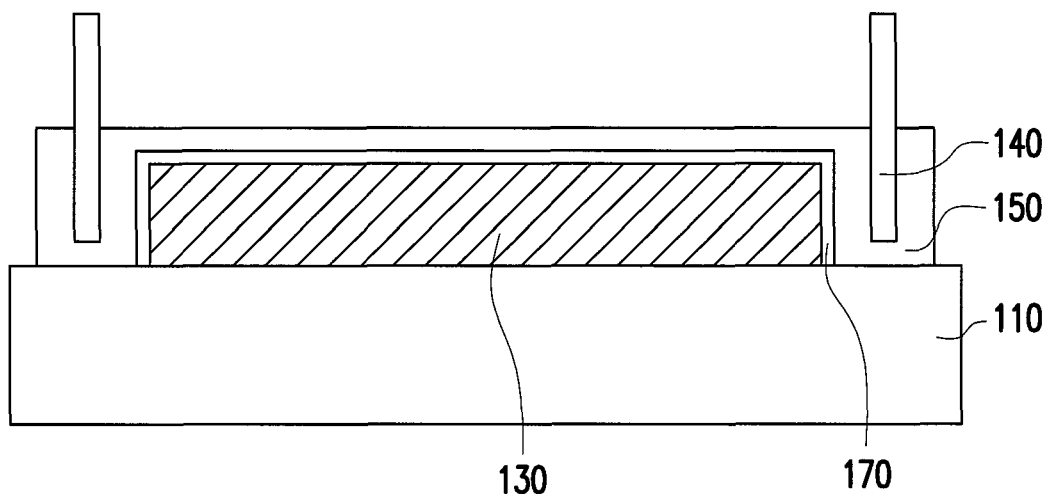

As shown in FIG. 7B, a side wall barrier structure 140 is disposed on the first adhesive 150. The side wall barrier structure 140 is adhered to the first substrate 110 through the first adhesive 150 and surrounds the environmental sensitive electronic device 130. In the present exemplary embodiment, the side wall barrier structure 140 is picked up by a fixture (not shown) and is implanted into to the first adhesive 150 by pressure, such that the side wall barrier structure 140 and the first adhesive 150 are tightly adhered to each other. The first adhesive 150 is cured by heat or ultraviolet light, such that the first substrate 110 and the side wall barrier structure 140 are tightly bonded together.

Figure 7C:
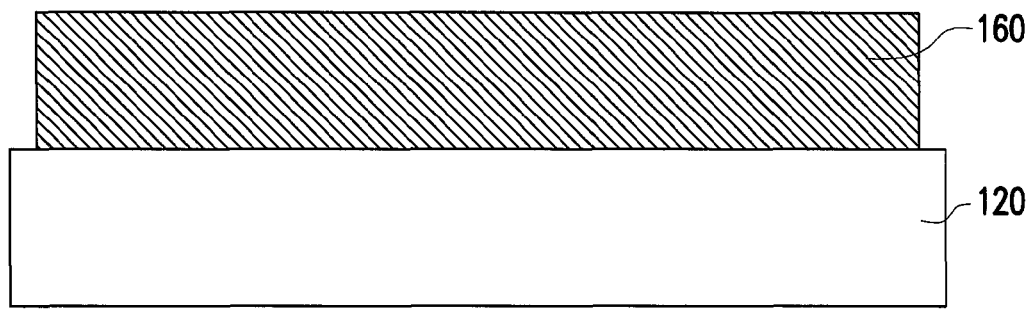
Figure 7D:
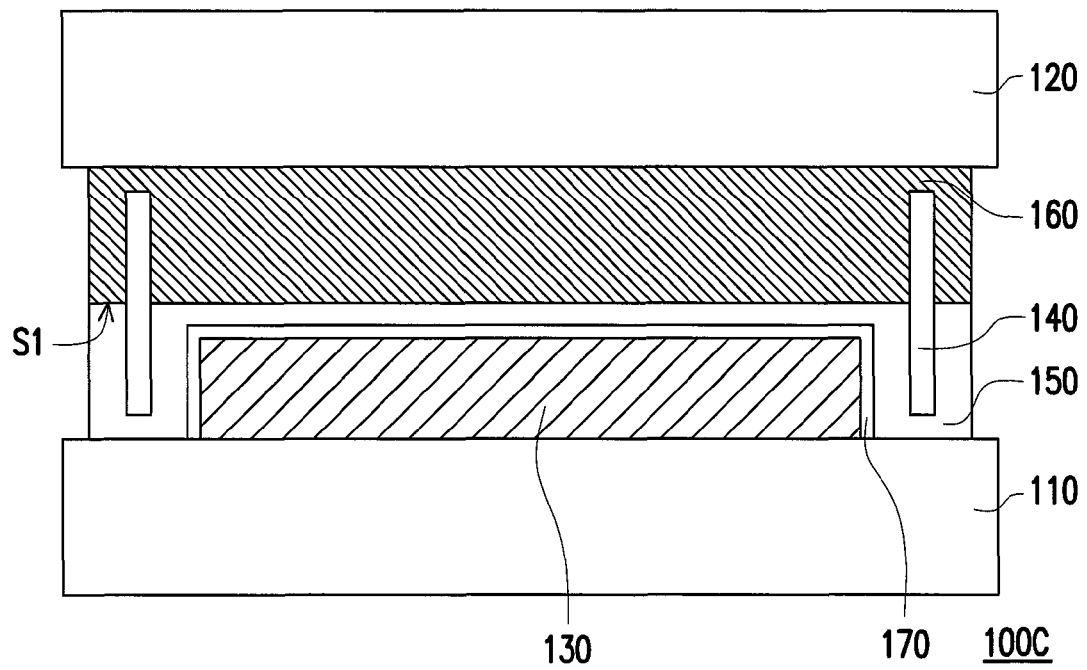
Figure 8A:
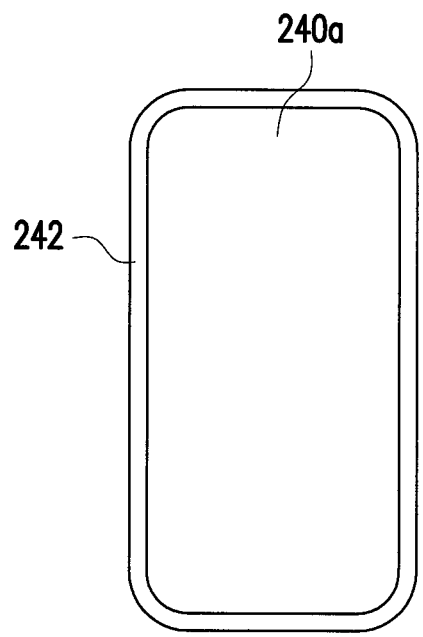
FIG. 8A to FIG. 8H are schematic views illustrating a side wall barrier structure according to other exemplary embodiments of the disclosure.
Figure 8B:
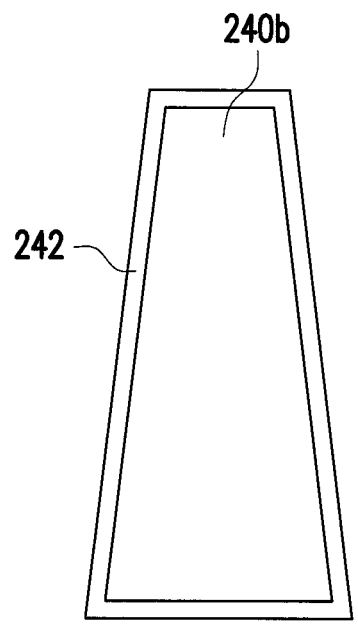
Figure 8C:
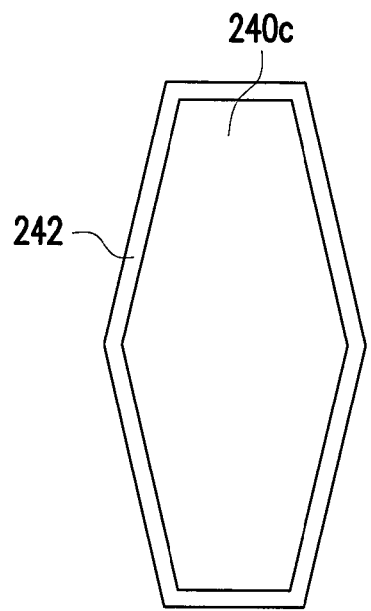
Figure 8D:
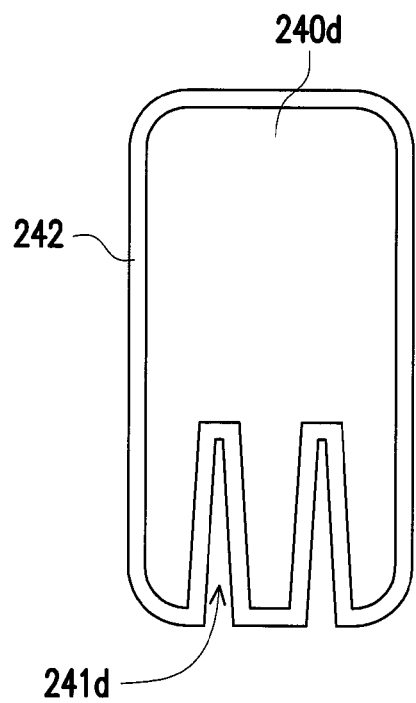
Figure 8E:
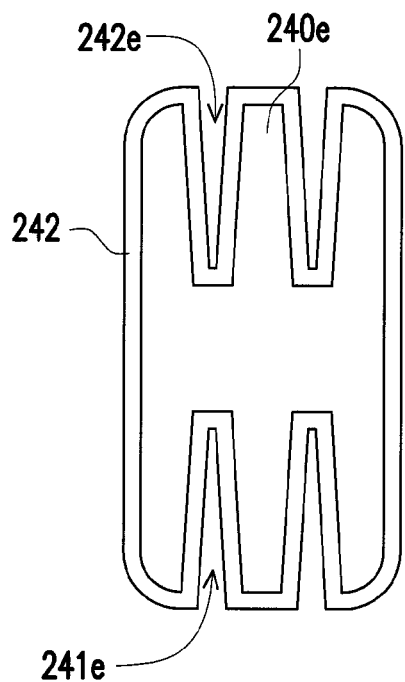
Figure 8F:
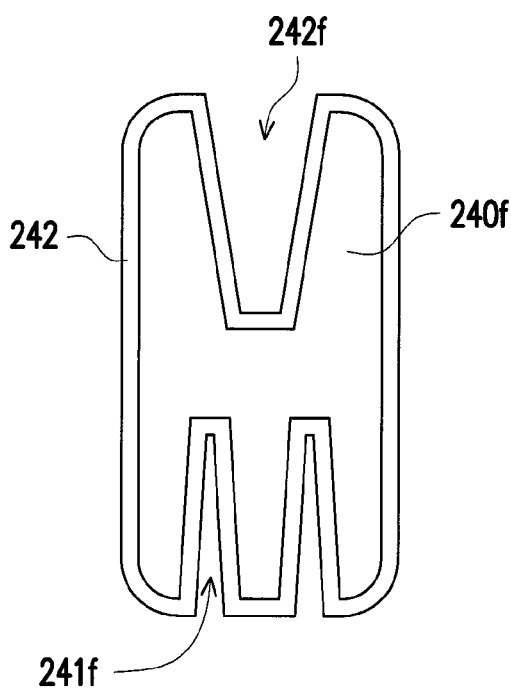
Figure 8G:
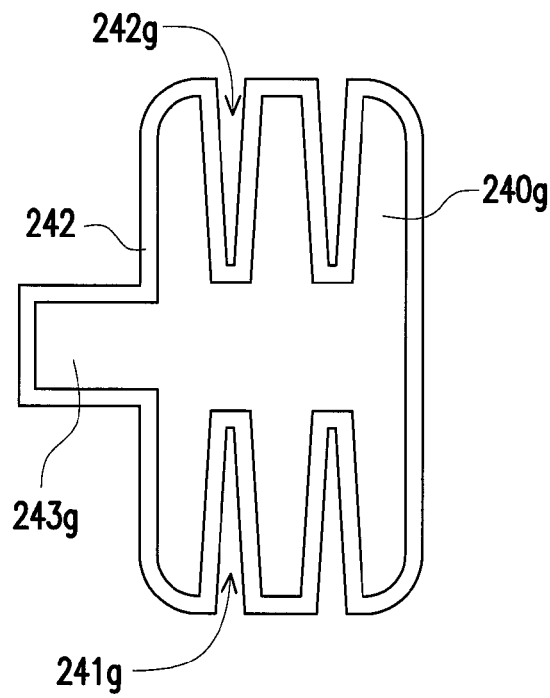
Figure 8H:
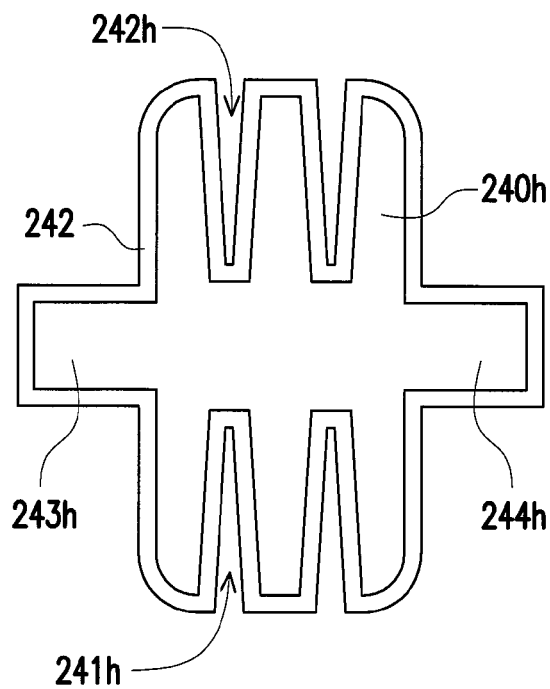

As shown in FIG. 7C and FIG. 7D, a second adhesive 160 is formed on a second substrate 120. The second substrate 120 and the side wall barrier structure 140 are bonded together through the second adhesive 160, and the side wall barrier structure 140, the first adhesive 150, and the second adhesive 160 are located between the first substrate 110 and the second substrate 120. In the present exemplary embodiment, the second adhesive 160 is provided by a dispensing head (not shown) and is coated onto the second substrate 120, for instance. After the second adhesive 160 is coated onto the second substrate 120, the second substrate 120 is tightly bonded to the side wall barrier structure 140 on the first adhesive 150 through the second adhesive 160 by frame press, for instance. So far, the environmental sensitive electronic device package 100C is substantially formed. The second adhesive 160 is cured by heat or ultraviolet light, such that the second substrate 120 and the side wall barrier structure 140 are tightly bonded together.

As shown in FIG. 7D, the first adhesive 150 encapsulates a portion of the side wall barrier structure 140, and the second adhesive 160 encapsulates the other portion. After the first and second adhesives 150 and 160 are adhered to each other, the first and second adhesives 150 and 160 together define an adhesion surface S1 therebetween. In another exemplary embodiment not shown in the drawings, the side wall barrier structure 140 may be picked up by a fixture (not shown) and is implanted into to the second adhesive 160 by pressure, which should not be construed as a limitation to the disclosure.

FIG. 8A to FIG. 8H are schematic views illustrating a side wall barrier structure according to other exemplary embodiments of the disclosure. With reference to FIG. 8A to FIG. 8H, the side wall barrier structures 240a to 240h respectively shown therein may also be disposed between the first and second substrates described in the previous embodiments and may also surround the environmental sensitive electronic device, respectively, so as to block moisture and oxygen. However, each of the side wall barrier structures 240a to 240h is further encapsulated by a barrier film 242. The barrier film 242 may be formed on the surface of each of the side wall barrier structures 240a to 240h by performing a surface treatment technique, such as vacuum plating, anodization, plating, electroless plating, and so on. Thanks to the barrier film 242, the adhesion between the side wall barrier structures 240a to 240h and the adhesive may be effectively enhanced, and moisture and oxygen may be effectively blocked. What is more, the bendability of the side wall barrier structures 240a to 240h can be ameliorated.

The cross-section of each of the side wall barrier structures 240a to 240h is different from one another. For instance, the cross-section of the side wall barrier structure 240a is shaped as a rectangle; the cross-section of the side wall barrier structure 240b is shaped as a trapezoid, for instance; the cross-section of the side wall barrier structure 240c is shaped as a hexagon, for instance. In another aspect, the side wall barrier structure 240a may be patterned to form the side wall barrier structures 240d to 240h, and there are two trenches 241d on the bottom surface of the side wall barrier structure 240d. Besides, there are two trenches 241e on the bottom surface of the side wall barrier structure 240e, and there are two trenches 242e on the top surface of the side wall barrier structure 240e. There are two trenches 241f on the bottom surface of the side wall barrier structure 240f, and there are one trench 242f on the top surface of the side wall barrier structure 240f. There are two trenches 241g on the bottom surface of the side wall barrier structure 240g, and there are two trenches 242g on the top surface of the side wall barrier structure 240g. Here, the side wall barrier structure 240g further has a lateral extension structure 243g. There are two trenches 241h on the bottom surface of the side wall barrier structure 240h, and there are two trenches 242h on the top surface of the side wall barrier structure 240h. Here, the side wall barrier structure 240h further has two lateral extension structures 243h and 244h respectively located on two opposite sides of the side wall barrier structure 240h.

The environmental sensitive electronic device package described in the exemplary embodiments of the disclosure has the side wall barrier structure in different types, and the side wall barrier structure surrounds the environmental sensitive electronic device. The side wall barrier structure is adhered to the first substrate and the second substrate through the first adhesive and the second adhesive, respectively, and the side wall barrier structure, the first adhesive, and the second adhesive are located between the first substrate and the second substrate. The environmental sensitive electronic device package described herein is capable of preventing moisture infiltration and oxygen permeation, and hence the lifetime of the environmental sensitive electronic device may be effectively extended.

The side wall barrier structure may have the trenches where the moisture absorbent may be disposed. The trenches are respectively filled with the first and second adhesives, and the first and second adhesives encapsulate the moisture absorbent in the trenches. Thereby, external moisture and oxygen can be precluded from entering the environmental sensitive electronic device package.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An environmental sensitive electronic device package comprising:
 a first substrate;
 an environmental sensitive electronic device located on the first substrate;
 a first adhesive located on the first substrate;
 a side wall barrier structure located on the first adhesive and adhered to the first substrate through the first adhesive;
 a second adhesive located on the side wall barrier structure; and a second substrate, the side wall barrier structure being adhered to the second substrate through the second adhesive, wherein the side wall barrier structure, the first adhesive, and the second adhesive are located between the first substrate and the second substrate, the side wall barrier and the first substrate are spaced apart by the first adhesive, the side wall barrier and the second substrate are spaced apart by the second adhesive, the first adhesive and the second adhesive are in contact with each other, and the first adhesive or the second adhesive covers the side wall barrier structure and the environmental sensitive electronic device;
wherein the side wall barrier structure surrounds the environmental sensitive electronic device.

2. The environmental sensitive electronic device package of claim 1, wherein the side wall barrier structure comprises a closed structure.

3. The environmental sensitive electronic device package of claim 1, wherein a shape of a cross-section of the side wall barrier structure comprises a polygonal shape, a circular shape, or an elliptic shape, the cross-section is substantially perpendicular to the first substrate, and a thickness of the side wall barrier structure is smaller than or substantially equal to 1 mm.

4. The environmental sensitive electronic device package of claim 1, wherein the side wall barrier structure has at least one trench located on a bottom surface of the side wall barrier structure and/or a top surface of the side wall barrier structure, the bottom surface faces the first substrate, and the top surface faces the second substrate.

5. The environmental sensitive electronic device package of claim 1, wherein a thickness of the first adhesive between the side wall barrier structure and the first substrate is smaller than 15 μm.

6. The environmental sensitive electronic device package of claim 1, wherein a thickness of the second adhesive between the side wall barrier structure and the second substrate is smaller than 15 μm.

7. The environmental sensitive electronic device package of claim 1, wherein the side wall barrier structure has at least one lateral extension structure extending toward and/or against the environmental sensitive electronic device.

8. The environmental sensitive electronic device package of claim 1, further comprising a packaging film encapsulating the environmental sensitive electronic device.

9. The environmental sensitive electronic device package of claim 1, further comprising a barrier film encapsulating the side wall barrier structure.

10. The environmental sensitive electronic device package of claim 4, further comprising at least one moisture absorbent arranged in the at least one trench on the bottom surface of the side wall barrier structure facing the first substrate and/or the at least one trench on the top surface of the side wall barrier structure facing the second substrate.

11. The environmental sensitive electronic device package of claim 10, wherein the at least one trench on the bottom surface of the side wall barrier structure facing the first substrate is filled with the first adhesive, and the first adhesive encapsulates the at least one moisture absorbent.

12. The environmental sensitive electronic device package of claim 10, wherein the at least one trench on the top surface of the side wall barrier structure facing the second substrate is filled with the second adhesive, and the second adhesive encapsulates the at least one moisture absorbent.

13. A manufacturing method of an environmental sensitive electronic device package, comprising
forming a first adhesive on a first substrate, wherein an environmental sensitive electronic device located on the first substrate;
disposing a side wall barrier structure on the first adhesive, wherein the side wall barrier structure is adhered to the first substrate through the first adhesive, and the side wall barrier structure surrounds the environmental sensitive electronic device; and
forming a second adhesive on a second substrate and bonding the second substrate and the side wall barrier structure together through the second adhesive, wherein the side wall barrier structure, the first adhesive, and the second adhesive are located between the first substrate and the second substrate; wherein the side wall barrier and the first substrate are spaced apart by the first adhesive, the side wall barrier and the second substrate are spaced apart by the second adhesive, the first adhesive and the second adhesive are in contact with each other, and the first adhesive or the second adhesive covers the side wall barrier structure and the environmental sensitive electronic device.

14. The manufacturing method of claim 13, further comprising:
forming a package film on the environmental sensitive electronic device to encapsulate the environmental sensitive electronic device.

15. The manufacturing method of claim 13, wherein the side wall barrier structure comprises a closed structure.

16. The manufacturing method of claim 13, wherein a shape of a cross-section of the side wall barrier structure comprises a polygonal shape, a circular shape, or an elliptic shape, the cross-section is substantially perpendicular to the first substrate, and a thickness of the side wall barrier structure is smaller than or substantially equal to 1 mm.

17. The manufacturing method of claim 13, further comprising forming at least one trench on a bottom surface of the side wall barrier structure facing the first substrate and/or on a top surface of the side wall barrier structure facing the second substrate.

18. The manufacturing method of claim 13, wherein a thickness of the first adhesive between the side wall barrier structure and the first substrate is smaller than 15 μm.

19. The manufacturing method of claim 13, wherein a thickness of the second adhesive between the side wall barrier structure and the second substrate is smaller than 15 μm.

20. The manufacturing method of claim 13, wherein the side wall barrier structure has at least one lateral extension structure extending toward and/or against the environmental sensitive electronic device.

21. The manufacturing method of claim 13, further comprising:
forming a barrier film on the side wall barrier structure to encapsulate the side wall structure.

22. The manufacturing method of claim 17, further comprising:
disposing a moisture absorbent in the at least one trench on the bottom surface of the side wall barrier structure, the bottom surface facing the first substrate; and
filling the at least one trench on the bottom surface of the side wall barrier structure with the first adhesive, wherein the first adhesive encapsulates the moisture absorbent.

23. The manufacturing method of claim 17, further comprising:
disposing a moisture absorbent in the at least one trench on the top surface of the side wall barrier structure, the top surface facing the second substrate; and
filling the at least one trench on the top surface of the side wall barrier structure with the second adhesive, wherein the second adhesive encapsulates the moisture absorbent.

24. An environmental sensitive electronic device package comprising:
a first substrate;
an environmental sensitive electronic device located on the first substrate;
at least one first glass frit located on the first substrate;

a side wall barrier structure located on the at least one first glass frit and adhered to the first substrate through the at least one first glass frit;

a second glass frit located on the side wall barrier structure; and a second substrate, the side wall barrier structure being adhered to the second substrate through the second glass flit, wherein the side wall barrier structure, the at least one first glass frit, and the second glass frit are located between the first substrate and the second substrate, the side wall barrier and the first substrate are spaced apart by the first glass flit, the side wall barrier and the second substrate are spaced apart by the second glass frit, the first glass frit and the second glass frit are in contact with each other, and the first glass frit or the second glass frit covers the side wall barrier structure and the environmental sensitive electronic device;

wherein the side wall barrier structure surrounds the environmental sensitive electronic device.

25. The environmental sensitive electronic device package of claim 24, wherein the side wall barrier structure comprises a closed structure.

26. The environmental sensitive electronic device package of claim 24, wherein a shape of a cross-section of the side wall barrier structure comprises a polygonal shape, a circular shape, or an elliptic shape, the cross-section is substantially perpendicular to the first substrate, and a thickness of the side wall barrier structure is smaller than or substantially equal to 1 mm.

27. The environmental sensitive electronic device package of claim 24, wherein the side wall barrier structure has at least one trench located on a bottom surface of the side wall barrier structure and/or a top surface of the side wall barrier structure, the bottom surface faces the first substrate, and the top surface faces the second substrate.

28. The environmental sensitive electronic device package of claim 24, wherein a thickness of the at least one first glass frit between the side wall barrier structure and the first substrate is smaller than 15 μm.

29. The environmental sensitive electronic device package of claim 24, wherein a thickness of the second glass frit between the side wall barrier structure and the second substrate is smaller than 15 μm.

30. The environmental sensitive electronic device package of claim 24, wherein the side wall barrier structure has at least one lateral extension structure extending toward and/or against the environmental sensitive electronic device.

31. The environmental sensitive electronic device package of claim 24, further comprising a packaging film encapsulating the environmental sensitive electronic device.

32. The environmental sensitive electronic device package of claim 27, further comprising at least one moisture absorbent arranged in the at least one trench on the bottom surface of the side wall barrier structure facing the first substrate and/or the at least one trench on the top surface of the side wall barrier structure facing the second substrate.

33. The environmental sensitive electronic device package of claim 32, wherein the at least one trench on the bottom surface of the side wall barrier structure facing the first substrate is filled with the at least one first glass frit, and the at least one first glass frit encapsulates the at least one moisture absorbent.

34. The environmental sensitive electronic device package of claim 32, wherein the at least one trench on the top surface of the side wall barrier structure facing the second substrate is filled with the second glass frit, and the second glass frit encapsulates the at least one moisture absorbent.

* * * * *